(12) United States Patent
Wang et al.

(10) Patent No.: US 11,793,034 B2
(45) Date of Patent: Oct. 17, 2023

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Rong Wang, Beijing (CN); Bo Zhang, Beijing (CN); Xiaoqing Shu, Beijing (CN); Xiangdan Dong, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 79 days.

(21) Appl. No.: 17/428,829

(22) PCT Filed: Apr. 9, 2020

(86) PCT No.: PCT/CN2020/083957
§ 371 (c)(1),
(2) Date: Aug. 5, 2021

(87) PCT Pub. No.: WO2021/203358
PCT Pub. Date: Oct. 14, 2021

(65) Prior Publication Data
US 2022/0310723 A1    Sep. 29, 2022

(51) Int. Cl.
*H10K 59/122*    (2023.01)
*H10K 59/88*    (2023.01)
*H10K 59/131*    (2023.01)

(52) U.S. Cl.
CPC ......... *H10K 59/122* (2023.02); *H10K 59/131* (2023.02); *H10K 59/88* (2023.02)

(58) Field of Classification Search
CPC ........ H01L 27/3223; G09G 2300/0413; H10K 59/88
See application file for complete search history.

(56) References Cited

U.S. PATENT DOCUMENTS

| | | |
|---|---|---|
| 10,573,236 B1 | 2/2020 | Gao et al. |
| 10,636,847 B2 | 4/2020 | Yu et al. |

(Continued)

FOREIGN PATENT DOCUMENTS

| | | |
|---|---|---|
| CN | 107564412 A | 1/2018 |
| CN | 108352151 A | 7/2018 |

(Continued)

OTHER PUBLICATIONS

The Extended European Search Report dated Jul. 7, 2023; Appln. No. 20930574.7.

*Primary Examiner* — Kevin M Nguyen

(57) ABSTRACT

A display panel and a display device are provided. The display panel includes a display region; a light transmitting region at a side of the display region or surrounded by the display region; a first dummy region between the display region and the light transmitting region, the first dummy region being a non-light emitting region; a first signal line in the display region and the first dummy region; a display pixel unit in the display region and including a display pixel circuit; and a first dummy pixel unit in the first dummy region and including a first dummy pixel circuit, the display pixel circuit is connected with the first signal line, and the first dummy pixel circuit is connected with the first signal line.

18 Claims, 24 Drawing Sheets

(56) References Cited

U.S. PATENT DOCUMENTS

| | | |
|---|---|---|
| 2014/0339508 A1 | 11/2014 | Hong |
| 2016/0190166 A1 | 6/2016 | Kim et al. |
| 2019/0073976 A1* | 3/2019 | Yeh .................. G02F 1/136286 |
| 2020/0013834 A1 | 1/2020 | Park et al. |
| 2020/0082758 A1* | 3/2020 | Yi ....................... G09G 3/3258 |
| 2020/0118496 A1 | 4/2020 | Kim et al. |
| 2020/0176527 A1* | 6/2020 | An ....................... H10K 59/122 |
| 2020/0219944 A1 | 7/2020 | Yi |

FOREIGN PATENT DOCUMENTS

| | | |
|---|---|---|
| CN | 109584798 A | 4/2019 |
| CN | 109616495 A | 4/2019 |
| EP | 3 660 827 A1 | 6/2020 |
| WO | 2018/038814 A1 | 3/2018 |

\* cited by examiner

LY1

111

L1

T10(C11)

110

L2

DISPLAY PANEL AND DISPLAY DEVICE

TECHNICAL FIELD

Embodiments of the present disclosure relate to a display panel and a display device.

BACKGROUND

In recent years, the active-matrix organic light emitting diode (AMOLED) display device has developed rapidly in the display field, and has been widely used. At the same time, the requirement of consumers for display effect of the display device has been higher and higher.

AMOLED flexible screen technology is becoming more and more mature, and its characteristics of being foldable, high contrast and low power consumption, etc., make it the next generation display mode instead of liquid crystal display (LCD).

SUMMARY

Embodiments of the disclosure provide a display panel and a display device.

Embodiments of the disclosure provide a display panel, comprising: a display region; a light transmitting region at a side of the display region; a first dummy region between the display region and the light transmitting region, the first dummy region being a non-light emitting region; a first signal line in the display region and the first dummy region; a display pixel unit in the display region and comprising a display pixel circuit; and a first dummy pixel unit in the first dummy region and comprising a first dummy pixel circuit, the display pixel circuit is connected with the first signal line, and the first dummy pixel circuit is connected with the first signal line.

In the display panel according to some embodiments of the disclosure, a structure of the first dummy pixel circuit is the same as a structure of the display pixel circuit.

In the display panel according to some embodiments of the disclosure, both the display pixel circuit and the first dummy pixel circuit include a transistor.

In the display panel according to some embodiments of the disclosure, both the display pixel circuit and the first dummy pixel circuit include a storage capacitor.

The display panel according to some embodiments of the disclosure further comprises: a second signal line and a connection element, wherein the second signal line has a same extending direction as the first signal line, the second signal line is connected with the first signal line through the connection element, and the second signal line is connected with the first dummy pixel unit.

In the display panel according to some embodiments of the disclosure, the first signal line comprises a gate line, and the second signal line comprises a reset control signal line.

In the display panel according to some embodiments of the disclosure, a load formed by the first dummy pixel unit connected with the first signal line is smaller than a load missing from the first signal line before compensation.

In the display panel according to some embodiments of the disclosure, the load formed by the first dummy pixel unit connected with the first signal line is 65%-80% of the load missing from the first signal line before compensation.

In the display panel according to some embodiments of the disclosure, the load formed by the first dummy pixel unit connected with the first signal line is 70% of the load missing from the first signal line before compensation.

The display panel according to some embodiments of the disclosure further comprises: a second dummy pixel unit and a second dummy region, wherein the second dummy pixel unit is in the second dummy region, the second dummy region is close to an edge of the display panel and at a side of the first dummy region away from the display region, the second dummy pixel unit comprises a second dummy pixel circuit, and a structure of the second dummy pixel circuit is a part of a structure of the first dummy pixel circuit.

In the display panel according to some embodiments of the disclosure, a plurality of first signal lines are provided, the plurality of first signal lines extending along a first direction, the plurality of first signal lines are arranged along a second direction, the first direction is intersected with the second direction, and loads of the plurality of first signal lines increase linearly in the second direction.

The display panel according to some embodiments of the disclosure further comprises a notch, wherein the notch is located in the light transmitting region.

In the display panel according to some embodiments of the disclosure, a plurality of first dummy pixel units are provided, and both ends of the first signal line are connected with the plurality of first dummy pixel units, respectively.

In the display panel according to some embodiments of the disclosure, a count of the first dummy pixel units connected with each end of the first signal line is greater than two.

In the display panel according to some embodiments of the disclosure, the first signal line is on at least one side of two opposite sides of the notch in an extending direction of the first signal line, and a count of the first dummy pixel units connected with one end of the first signal line close to the notch is greater than a count of the first dummy pixel units connected with one end of the first signal line away from the notch.

In the display panel according to some embodiments of the disclosure, an edge of the display region close to the light transmitting region is a curve, which includes a valley and ridges respectively arranged at both sides of the valley, and the light transmitting region is located at a position of the valley.

In the display panel according to some embodiments of the disclosure, a slope of a portion of the curve at a side of the ridge close to the notch is greater than a slope of a portion of the curve at a side of the ridge away from the notch.

In the display panel according to some embodiments of the disclosure, a plurality of first signal lines are provided, the plurality of first signal lines extending along a first direction, the plurality of first signal lines are arranged along a second direction, the first direction is intersected with the second direction, and loads of the plurality of first signal lines decrease linearly and then increase linearly in the second direction.

In the display panel according to some embodiments of the disclosure, the light transmitting region is surrounded by the display region; the light transmitting region comprises a through hole region, the through hole region comprises a first through hole region and a second through hole region, the first dummy region includes a portion between the first through hole region and the second through hole region, and the first dummy pixel unit is in the portion of the first dummy region between the first through hole region and the second through hole region.

The display panel according to some embodiments of the disclosure further comprises a pixel definition layer, wherein the pixel definition layer is provided with an opening in the display region to define a light emitting area of the display pixel unit, and the pixel definition layer is not provided with an opening in the first dummy region, so that the first dummy pixel unit does not emit light.

In the display panel according to some embodiments of the disclosure, the first dummy pixel unit further comprises a dummy element, the dummy element is not connected with the first dummy pixel circuit, or a first electrode of the dummy element is not in contact with a light emitting functional layer of the dummy element.

The display panel according to some embodiments of the disclosure further comprises a data line, a light emitting control signal line, a first power line, a second power line, a reset control signal line, a first initialization signal line and a second initialization signal line, wherein the first dummy pixel unit further comprises a dummy element, and the first dummy pixel unit comprises a driving transistor, a data writing transistor, a threshold compensation transistor, a first light emitting control transistor, a second light emitting control transistor, a first reset transistor, a second reset transistor and a storage capacitor, a first electrode of the storage capacitor is electrically connected with a second electrode of the threshold compensation transistor, and a second electrode of the storage capacitor is electrically connected with the first power line; a gate electrode of the data writing transistor is electrically connected with the first signal line, and a first electrode and a second electrode of the data writing transistor are respectively electrically connected with the data line and a first electrode of the driving transistor; a gate electrode of the threshold compensation transistor is electrically connected with the first signal line, a first electrode of the threshold compensation transistor is electrically connected with a second electrode of the driving transistor, and a second electrode of the threshold compensation transistor is electrically connected with a gate electrode of the driving transistor; a gate electrode of the first light emitting control transistor and a gate electrode of the second light emitting control transistor are both connected with the light emitting control signal line; a first electrode and a second electrode of the first light emitting control transistor are respectively electrically connected with the first power line and the first electrode of the driving transistor, a first electrode of the second light emitting control transistor is electrically connected with the second electrode of the driving transistor, and a second electrode of the dummy element is electrically connected with the second power line; a gate electrode of the first reset transistor is electrically connected with the reset control signal line, a first electrode of the first reset transistor is electrically connected with the first initialization signal line, and a second electrode of the first reset transistor is electrically connected with the gate electrode of the driving transistor; a gate electrode of the second reset transistor is electrically connected with the second signal line, and a first electrode of the second reset transistor is electrically connected with the second initialization signal line; the dummy element is not provided with a first electrode, or in the case where the dummy element is provided with a first electrode, a second electrode of the second light emitting control transistor is not electrically connected with a first electrode of the dummy element, and a second electrode of the second reset transistor is not electrically connected with the first electrode of the dummy element.

At least one embodiment of the disclosure provides a display device comprising the display panel according to any items as mentioned above.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At present, for a flexible screen that needs to be provided with a light transmitting region, a special-shaped display region is formed near the light transmitting region, and the arrangement of the light transmitting region will have an influence on the display effect of the screen. If the special-shaped display region is not compensated, display defects, such as Mura, etc., will occur due to brightness difference when the whole screen displays. Therefore, compensation design for the special-shaped display region should be considered for the display screen provided with the light transmitting region. For example, in terms of setting a light transmitting region, a light transmitting region can be formed by setting a notch, or a light transmitting region can be formed by defining a through hole.

Figure 1:
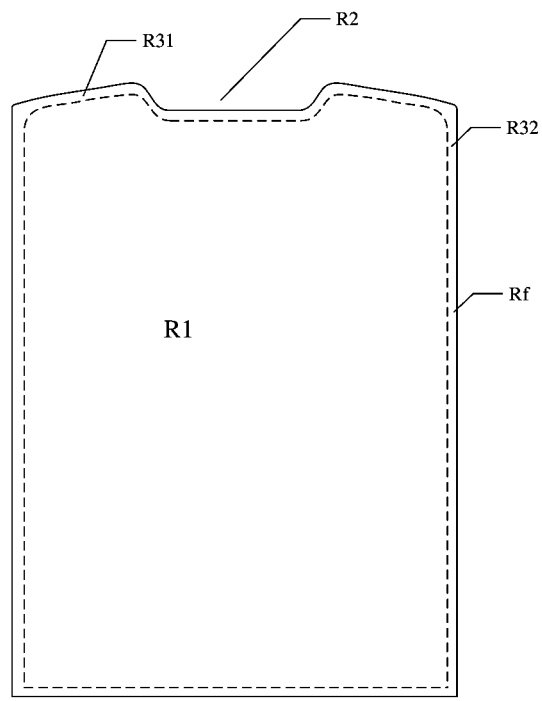
FIG. 1 is a schematic diagram of a display panel.

FIG. 1 is a schematic diagram of a display panel. As illustrated in FIG. 1, the display panel includes a display region R1, a frame region Rf and a light transmitting region R2. The solid line in FIG. 1 is the outline of the display panel, and the dashed line in FIG. 1 is the boundary of the display region of the display panel. The frame region Rf is located at the outer side of the display region R1 and surrounds the display region R1. For example, the outline is a cutting line. After the encapsulation layer is formed, cutting is performed according to the outline, so as to form a single display panel.

Figure 2:
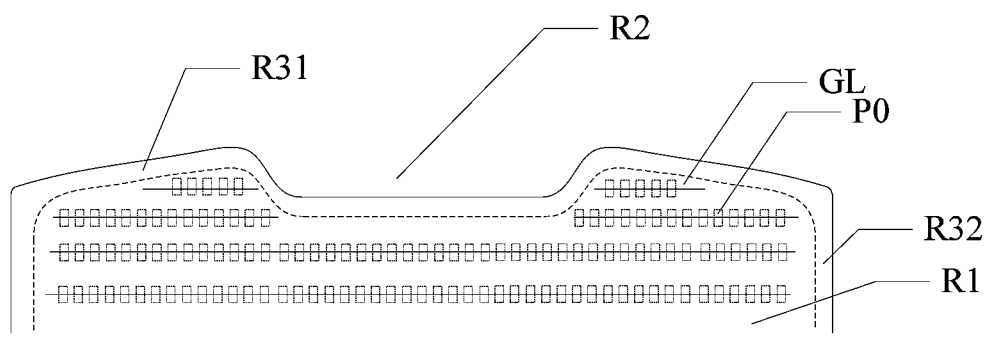
FIG. 2 is a partial view of the display panel illustrated in FIG. 1.

FIG. 2 is a partial view of the display panel illustrated in FIG. 1. As illustrated in FIG. 2, the display panel includes a gate line GL and a plurality of display pixel units P0 connected with the gate line GL.

As illustrated in FIG. 2, a certain number of display pixel units are missing in the display pixel unit row corresponding to the light transmitting region R2. The larger the light transmitting region is, the more the number of display pixel units which are missing is, which leads to the load reduction of the gate line of the row of display pixel units. The inconsistent loads of the gate lines of respective rows of display pixel units will lead to different charging time of the display pixel units. If the charging time difference between gate lines of adjacent rows of display pixel units is too large, the current difference between the adjacent two rows of display pixel units will be large. When the current difference exceeds a specification, Mura will occur in this region. For example, as illustrated in FIG. 2, in the vicinity of the light transmitting region R2, the upper the gate line GL, the lower the load thereof, and the longer the charging time; the turn-on time points of the gate signals are different, and the refresh frequency is different; and the voltages written into the display pixel units are different under the same data signal, which leads to the brightness of the upper part of the display panel being higher than the brightness of the lower part of the display panel; the picture is different when the whole screen displays, and poor display phenomenon, such as Mura, etc., occurs. In order to make the loads of the gate lines of respective rows of display pixel units in the vicinity of the light transmitting region have little difference, it is necessary to compensate the loads of the gate lines of respective rows of display pixel units in the vicinity of the light transmitting region. In the process of compensation, it is necessary to make full use of the space and adopt a suitable compensation scheme according to the special-shaped degree of the display region, so as to optimize the display effect, and strive to achieve the purpose of optimizing the display effect and narrowing the frame.

Figure 3:
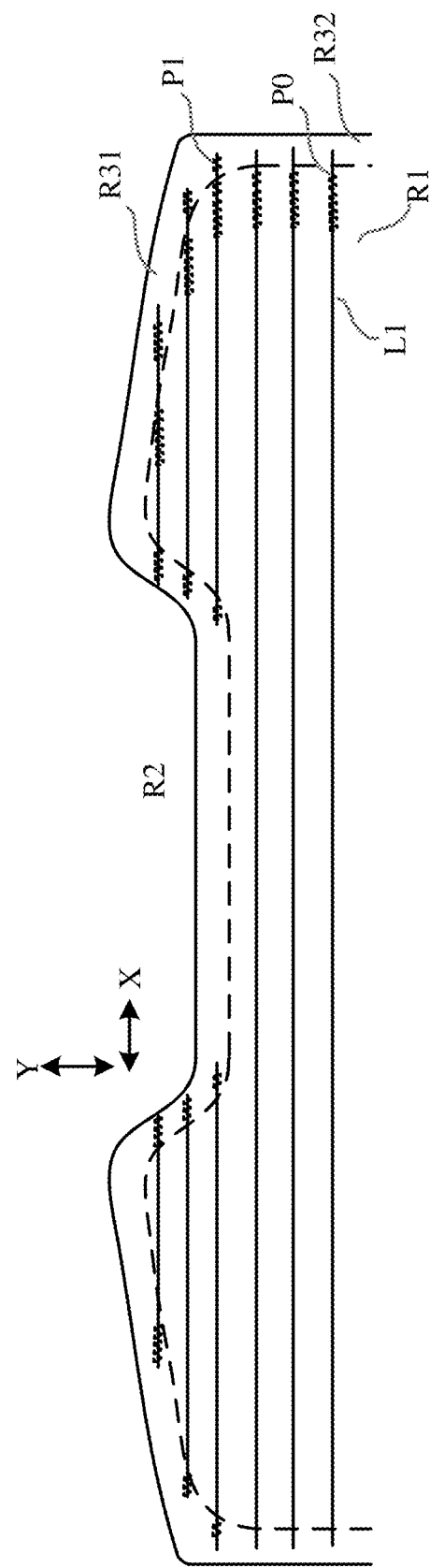
FIG. 3 is a partial view of a display panel according to an embodiment of the present disclosure.

FIG. 3 is a partial view of a display panel according to an embodiment of the present disclosure. As illustrated in FIG. 3, the display panel includes a display region R1, a light transmitting region R2, a first dummy region R31, a first signal line L1, a display pixel unit P0, and a first dummy pixel unit P1.

As illustrated in FIG. 3, the light transmitting region R2 is located at one side of the display region R1, and in some other embodiments, the light transmitting region R2 can also be surrounded by the display region R1. The light transmitting region R2 can be used to place a sensing element, and the sensing element includes a camera, but is not limited thereto. For example, at least a part of the sensing element is located in the light transmitting region R2.

As illustrated in FIG. 3, the first dummy region R31 is located between the display region R1 and the light transmitting region R2, and the first dummy region R31 is a non-light emitting region. Referring to FIGS. 1-3, the region between the boundary of the display region illustrated by the dashed line and the outline of the display panel illustrated by the solid line can be a frame region. The frame region is a non-light emitting region, and the first dummy region R31 is located in the frame region.

As illustrated in FIG. 3, the first signal line L1 is located in the display region R1 and the first dummy region R31. That is, the first signal line L1 includes a portion located in the display region R1 and a portion located in the first dummy region R31. The display pixel unit P0 is located in the display region R1. The display pixel unit P0 can emit light. The first dummy pixel unit P1 is located in the first dummy region R31. For the sake of clarity, part of the display pixel units P0 and part of the first dummy pixel units P1 are illustratively illustrated in FIG. 3. The number of display pixel units P0 and the number of first dummy pixel units P1 can be set as needed.

Figure 4:
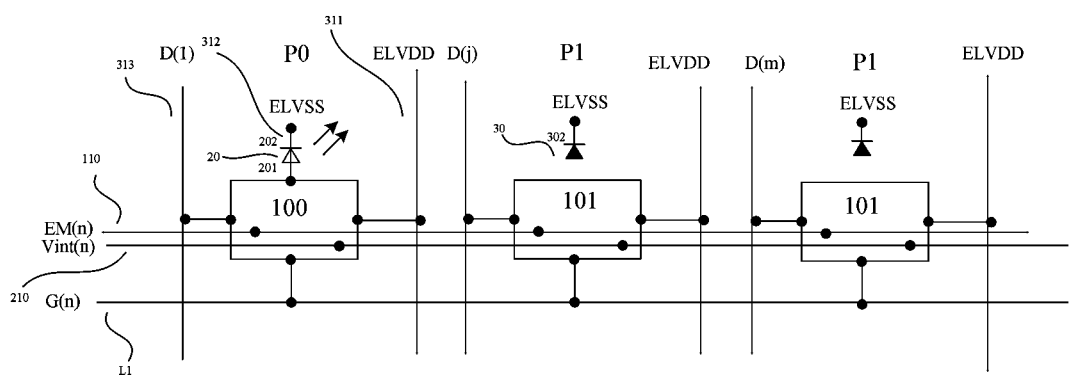
FIG. 4 is a schematic diagram of a display pixel unit, a dummy pixel unit and a signal line used to provide a signal for the display pixel unit in a display panel according to an embodiment of the present disclosure.

FIG. 4 is a schematic diagram of a display pixel unit, a dummy pixel unit and a signal line used to provide a signal for the display pixel unit in a display panel according to an embodiment of the present disclosure. As illustrated in FIG. 4, the display pixel unit P0 includes a display pixel circuit 100. The first dummy pixel unit P1 includes a first dummy pixel circuit 101. The display pixel circuit 100 is connected with the first signal line L1, and the first dummy pixel circuit 101 is connected with the first signal line L1.

The display panel provided by the embodiments of the present disclosure, by providing the first dummy pixel circuit 101 for the first signal line L1 in the first dummy region, the load of the first signal line L1 is greatly increased, so that display defects, such as Mura, caused by uneven brightness during display, are avoided.

As illustrated in FIG. 4, the display pixel unit P0 includes a light emitting element 20 and a display pixel circuit structure 100 that provides a driving current for the light emitting element 20, the light emitting element 20 can be an electroluminescent element, for example, an organic electroluminescent element, such as an organic light emitting diode (OLED). The display pixel unit P0 is a pixel unit that emits light normally. The display pixel unit P0 is located in the display region R1.

As illustrated in FIG. 4, the display panel further includes an initialization signal line 210, a light emitting control signal line 110, a data line 313, a first power line 311, and a second power line 312. For example, the first signal line L1 is configured to provide a scan signal SCAN to the display pixel circuit structure 100. The light emitting control signal line 110 is configured to provide a light emitting control signal EM to the display pixel unit P0. The data line 313 is configured to provide a data signal DATA to the display pixel circuit structure 100, the first power line 311 is configured to provide a constant first voltage signal ELVDD to the display pixel circuit structure 100, the second power line 312 is configured to provide a constant second voltage signal ELVSS to the display pixel circuit structure 100, and the first voltage signal ELVDD is higher than the second voltage signal ELVSS. The initialization signal line 210 is configured to provide an initialization signal Vint to the display pixel circuit structure 100. The initialization signal Vint is a constant voltage signal, and the magnitude thereof can be between the first voltage signal ELVDD and the second voltage signal ELVSS, but is not limited to this case. For example, the initialization signal Vint can be less than or equal to the second voltage signal ELVSS. For example, the display pixel circuit structure 100 outputs a driving current to drive the light emitting element 20 to emit light under the control of signals such as the scan signal SCAN, the data signal DATA, the initialization signal Vint, the first voltage signal ELVDD, the second voltage signal ELVSS, and the light emitting control signal EM, etc. As illustrated in FIG. 4, the light emitting element 20 includes a first electrode 201 and a second electrode 202. The first electrode 201 is connected with the display pixel circuit structure 100, and the second electrode 202 is connected with the second power line 312.

As illustrated in FIG. 4, the first signal line L1 is connected with the first dummy pixel circuit 101, the first dummy pixel unit P1 includes a dummy element 30, the dummy element 30 is not connected with the first dummy pixel circuit 101, so that the first dummy pixel unit P1 does not emit light. For example, the pixel definition layer is not provided with an opening in the dummy region, so that the dummy element 30 is not connected with the first dummy pixel circuit 101. Of course, the first dummy pixel unit P1 may not emit light in other ways; for example, the dummy element 30 may not be provided with the first electrode or the light emitting functional layer. As illustrated in FIG. 4, the dummy element 30 includes a second electrode 302, and the second electrode 302 is connected with the second power line 312.

For example, in order to increase the load of the first signal line L1 at utmost, the structure of the first dummy pixel circuit 101 is the same as the structure of the display pixel circuit 100. The structure of the first dummy pixel circuit 101 is the same as the structure of the display pixel circuit 100, so that the part of the first signal line L1 located in the display pixel unit and the part of the first signal line L1 located in the first dummy pixel unit have the same environments and the similar loads; and the load of the first signal line L1 can be better compensated, so that the loads of adjacent first signal lines L1 are similar, thereby achieving a better compensation effect.

For example, both the display pixel circuit 100 and the first dummy pixel circuit 101 include a transistor. For example, both the display pixel circuit 100 and the first dummy pixel circuit 101 further include a storage capacitor.

Figure 5:
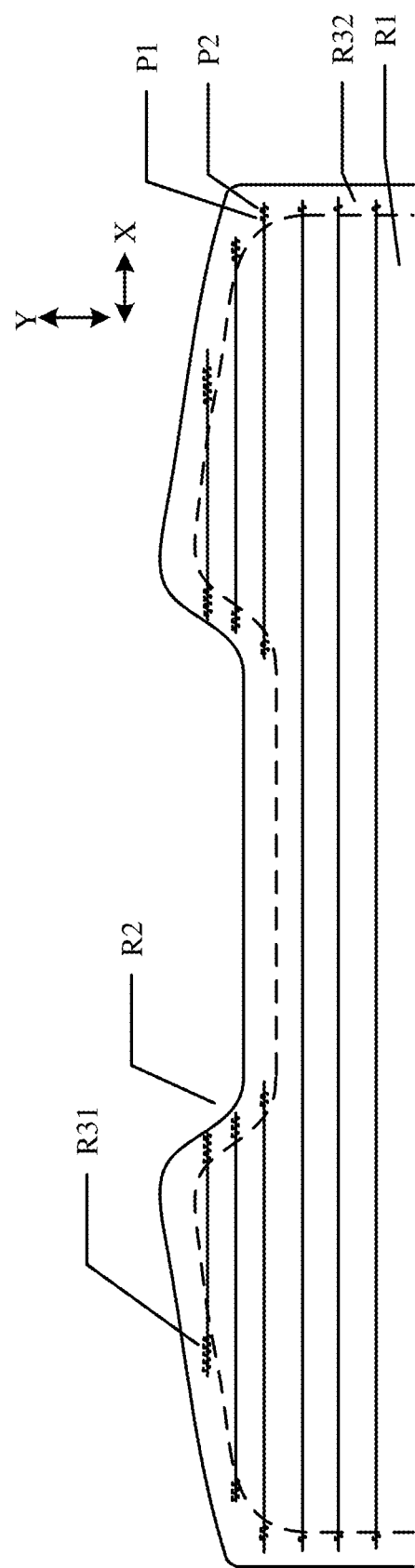
FIG. 5 is a partial view of a display panel according to an embodiment of the present disclosure.

FIG. 5 is a partial view of a display panel according to an embodiment of the present disclosure. Compared with the display panel illustrated in FIG. 3, the display panel illustrated in FIG. 5 further includes a second dummy pixel unit P2, the second dummy pixel unit P2 is located in a second dummy region R32, and the second dummy region R3 is close to an edge of the display panel. For example, the second dummy pixel unit P2 does not have the function of capacitance compensation, and the arrangement of the second dummy pixel unit P2 help to improve etching uniformity. For example, one second dummy pixel unit P2 is provided at the position of each first signal line close to the edge of the display panel. For example, in the vicinity of the light transmitting region, one second dummy pixel unit P2 is provided at the position of each first signal line close to the left edge of the display panel, and one second dummy pixel unit P2 is provided at the position of each first signal line close to the right edge of the display panel. In the case where the light transmitting region is a notch, in the vicinity of the light transmitting region, one second dummy pixel unit P2 is arranged at the position of each first signal line close to the notch of the display panel. In the embodiment of the present disclosure, the first signal line of the display pixel unit row which does not lack part of the display pixel units due to the arrangement of the light transmitting region may not be compensated for the load.

For example, as illustrated in FIG. 5, in the same row of display pixel units, the load of the first signal line located on the left side of the light transmitting region is consistent with the load of the first signal line located on the right side of the light transmitting region, thus avoiding display defects, such as Mura, on the left and right sides of the light transmitting region. For example, as illustrated in FIG. 5, in adjacent two rows of display pixel units, the loads of adjacent two first signal lines are the same or have little difference, thus avoiding poor display defects, such as Mura, in the upper and lower rows of display pixel units.

Figure 6:
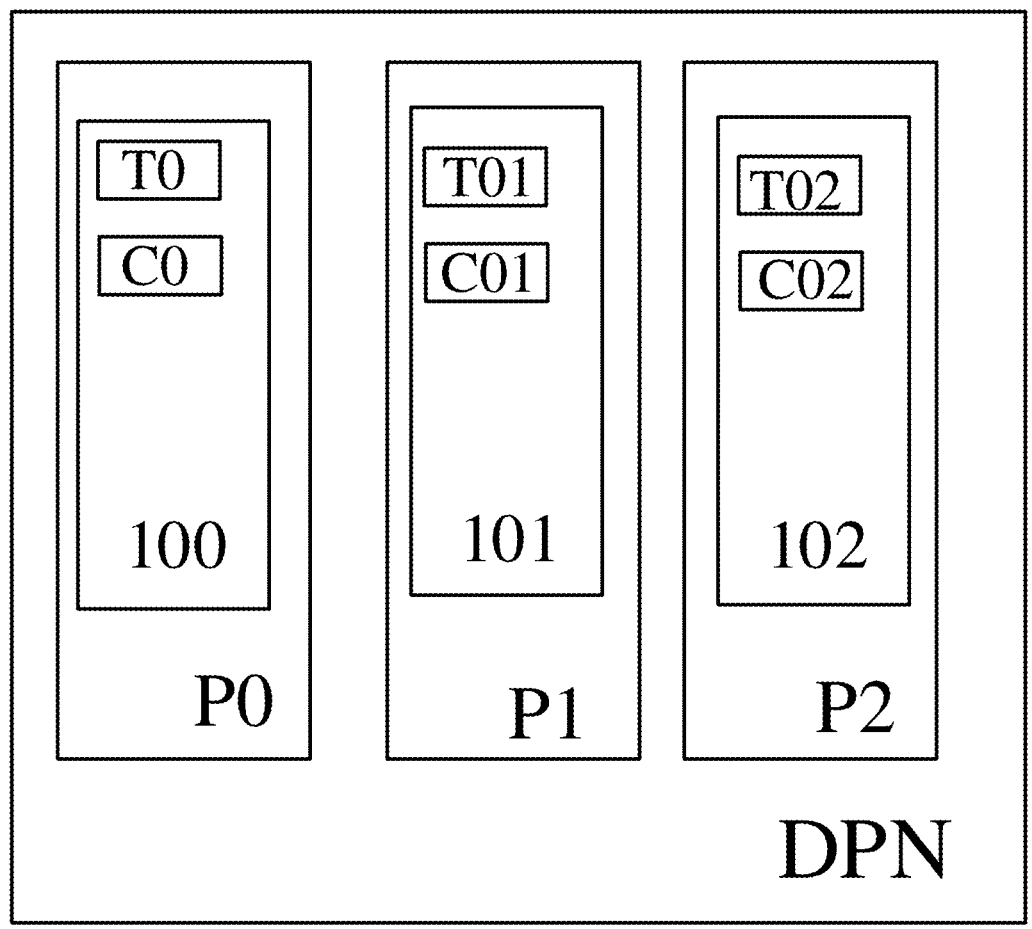
FIG. 6 is a schematic diagram of a display panel according to an embodiment of the present disclosure.

FIG. 6 is a schematic diagram of a display panel according to an embodiment of the present disclosure. As illustrated in FIG. 6, the display panel DPN includes a display pixel unit P0, a first dummy pixel unit P1, and a second dummy pixel unit P2. The second dummy pixel unit P2 includes a second dummy pixel circuit 102, the structure of the second dummy pixel circuit 102 is a part of the structure of the first dummy pixel circuit 101, or the same as the structure of the first dummy pixel circuit 101. As illustrated in FIG. 6, the display pixel unit P0 includes a display pixel circuit 100, and the first dummy pixel unit P1 includes a first dummy pixel circuit 101. The display pixel circuit 100 includes a transistor T0 and a capacitor C0, the first dummy pixel circuit 101 includes a transistor T01 and a capacitor C01, and the second dummy pixel circuit 102 includes a transistor T02 and a capacitor C02. For example, the structures of the transistor T0, the transistor T01 and the transistor T02 are the same, but are not limited thereto. For example, the structures of the capacitor C0, the capacitor C01 and the capacitor C02 are the same, but are not limited thereto. Of course, in some embodiments, the second dummy pixel circuit 102 may not be provided with at least one of the transistor or the capacitor. Of course, in some other embodiments, the second dummy pixel unit P2 and the second dummy pixel circuit 102 may not be provided.

Figure 7:
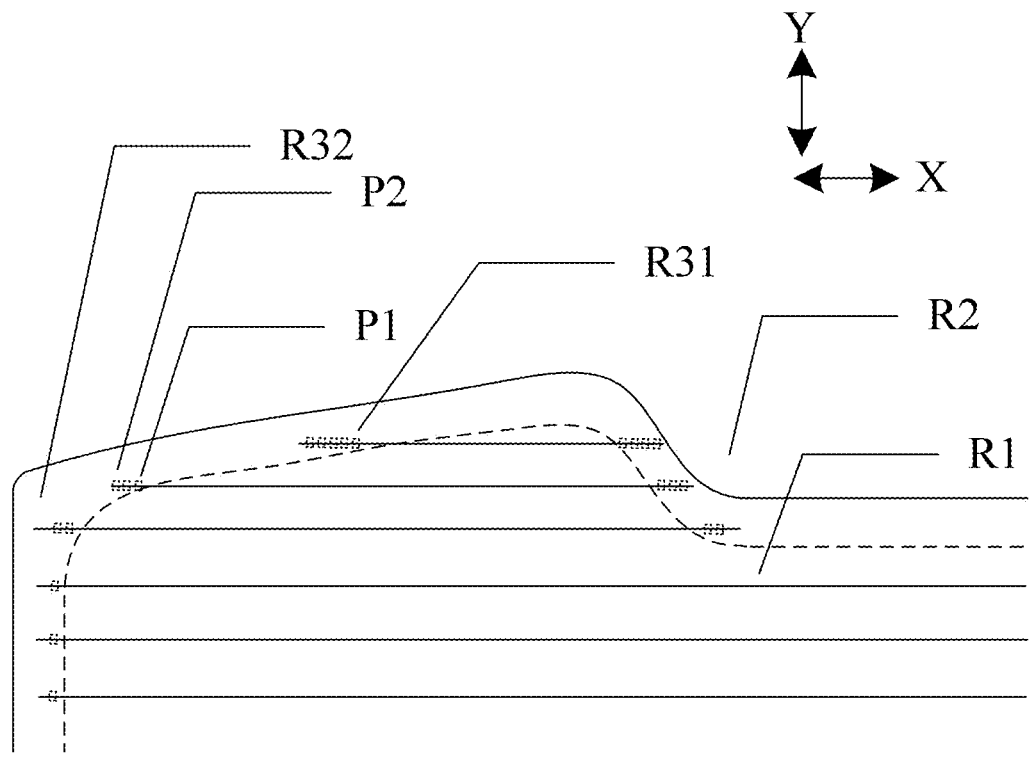
FIG. 7 is a partial structural view of FIG. 5.

FIG. 7 is a partial structural view of FIG. 5. As illustrated in FIG. 7, on the upper side of the display panel, the second dummy region R32 is farther away from the display region R1 than the first dummy region R31. On the left side of the display panel, the second dummy region R32 is adjacent to the display region R1.

For example, as illustrated in FIG. 3, FIG. 5 and FIG. 7, in order to play a better role in load compensation, both ends of the first signal line L1 are respectively connected with a plurality of first dummy pixel units P1.

For example, as illustrated in FIG. 3, FIG. 5 and FIG. 7, in order to facilitate the increase of the load of the first signal line L1, the number of the first dummy pixel units P1 connected with each end of the first signal line L1 is greater than two.

For example, as illustrated in FIG. 3, FIG. 5 and FIG. 7, a plurality of first signal lines L1 are provided, the plurality of first signal lines L1 extend along a first direction X, and the plurality of first signal lines L1 are arranged along a second direction Y, the first direction X is intersected with the second direction Y, and the loads of the first signal lines L1 increase linearly in the second direction Y. Therefore, the compensation can make the current of each row of display pixel units in the special-shaped display region also show a linearly increasing trend, can avoid the occurrence of the phenomenon that the display brightness of adjacent rows of display pixel units differs greatly, and can avoid display defects, such as Mura, caused by brightness difference. Of course, the display panel can further include a plurality of other first signal lines L1 with uniform or substantially uniform loads away from the light transmitting region, in addition to the plurality of first signal lines L1 with linearly increasing loads in the vicinity of the light transmitting region.

Figure 8:
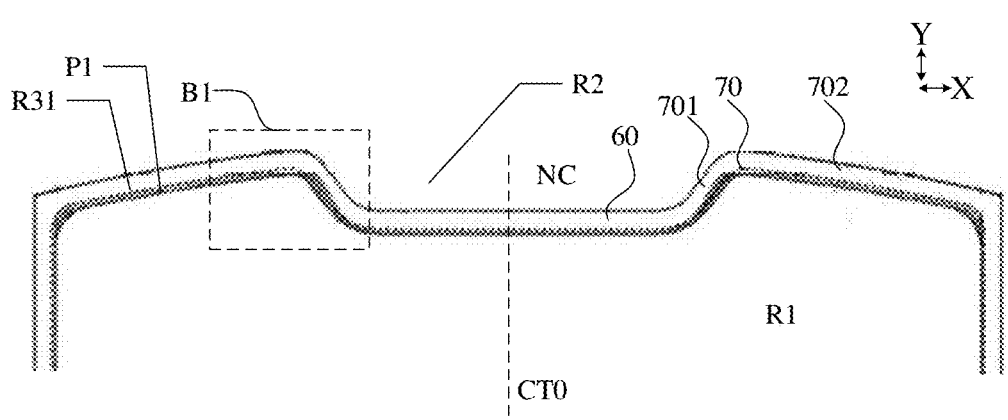
FIG. 8 is a schematic diagram showing the distribution of first dummy pixel units in a display panel according to an embodiment of the present disclosure.

FIG. 8 is a schematic diagram showing the distribution of first dummy pixel units in a display panel according to an embodiment of the present disclosure. The grey part located in the first dummy region R31 in FIG. 8 represents the first dummy pixel unit. As illustrated in FIG. 8, the display panel has an axisymmetric structure with respect to the center line CT0. The center line CT0 extends along the second direction Y. The display panel provided by other embodiments of the present disclosure can also have an axisymmetric structure with respect to the center line.

In actual compensation, the space of the special-shaped region should be made full use of, and first dummy pixel units should be arranged as many as possible on the premise of having space, so as to compensate the light transmitting region, which can not only better compensate the load, but also effectively reduce the frame.

As illustrated in FIG. 8, the left and right sides of the gap are shoulder-shaped. The margin is wider, and the position of the corner has a space where more first dummy pixel units P1 can be arranged.

Figure 9:
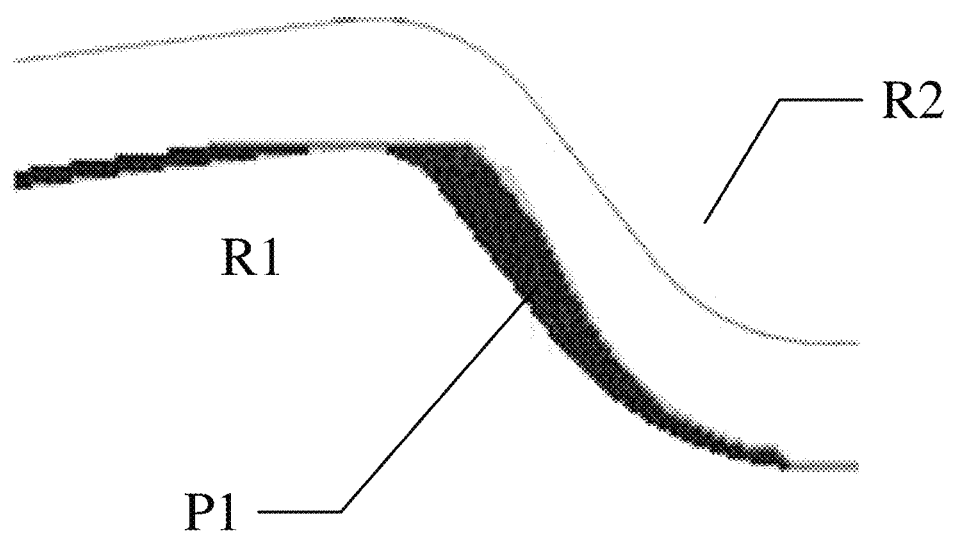
FIG. 9 is a schematic diagram of the structure within the dashed box B1 in FIG. 8.

FIG. 9 is a schematic diagram of the structure within the dashed box B1 in FIG. 8. The more the grey parts, the more the number of first dummy pixel units P1. The boundary between adjacent first dummy pixel units is not illustrated in FIG. 8 and FIG. 9.

The design of the compensation scheme provided by the embodiment of the present disclosure is to compensate the light transmitting region (notch) by using the first dummy pixel unit on the premise of making full use of the space of the special-shaped display region, thereby reducing the frame of the special-shaped region and achieving a better display effect of the special-shaped region.

Referring to FIG. 3, FIG. 5 and FIGS. 7-9, a same row of display pixel units includes a first signal line L1 located at a first side of the notch and a first signal line L1 located at a second side of the notch. For example, the first side of the notch is the left side of the notch, and the second side of the notch is the right side of the notch. The first side of the notch and the second side of the notch are opposite sides of the notch in the first direction X. For example, the first signal line L1 on the first side of the notch is not connected with the first signal line L1 on the second side of the notch, and the first signal line L1 on the first side of the notch is driven by a first gate driving circuit, while the first signal line L1 on the second side of the notch is driven by a second gate driving circuit. For example, the display pixel units in the vicinity of the notch is driven by a scan driving circuit, which is GOA (Gate driver On Array) mounted on the display panel, in a single-side driving mode.

For example, referring to FIG. 3, FIG. 5 and FIGS. 7-9, the first signal line L1 is located at one side of two opposite sides of the notch along the extending direction of the first signal line L1, and the number of first dummy pixel units P1 connected with one end of the first signal line L1 close to the notch is greater than the number of first dummy pixel units P1 connected with one end of the first signal line L1 away from the notch.

For example, referring to FIG. 3, FIG. 5 and FIGS. 7-9, the light transmitting region R2 is located at one side of the display region R1, and the light transmitting region R2 is located at the upper side of the display region R1 in the figure. As illustrated in FIG. 8, the edge of the display region R1 close to the light transmitting region R2 is a curve which includes a valley 60 and ridges 70 respectively arranged at both sides of the valley 60, and the light transmitting region R2 is located at the position of the valley 60. The light transmitting region R2 includes a notch NC.

For example, as illustrated in FIG. 8, the slope of a portion 701 of the curve located at one side of the ridge 70 close to the notch NC is greater than the slope of a portion 702 of the curve located at one side of the ridge away from the notch NC. For example, the slope refers to the angle between the part of the curve and the first direction X, or the angle between the part of the curve and the extending direction of the first signal line L1. In the case where the part of the curve has radian, it can refer to the angle between the tangent at a certain point of the part of the curve and the first direction X or the extending direction of the first signal line L1.

Figure 10:
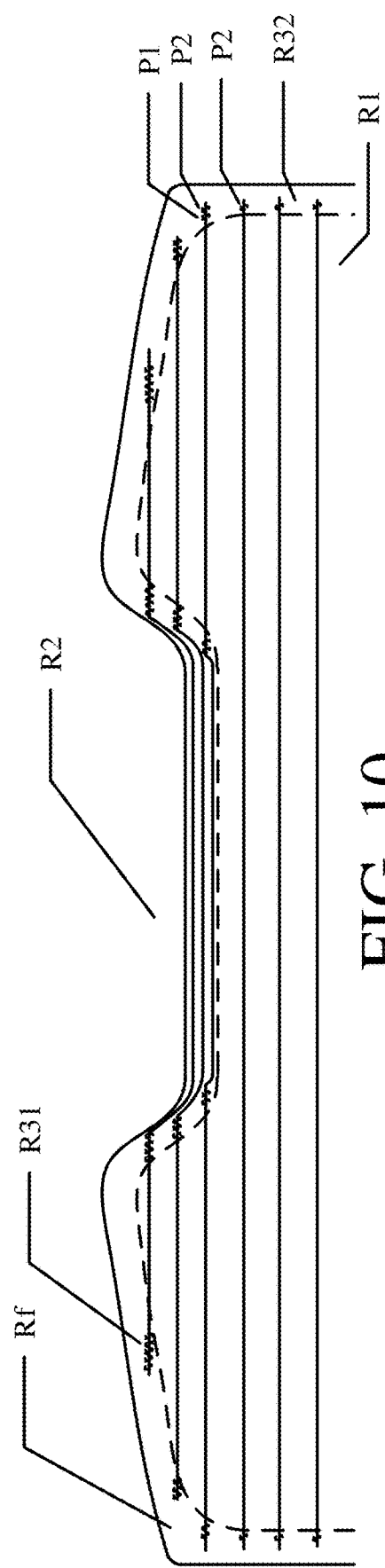
FIG. 10 is a schematic diagram of a display panel according to an embodiment of the present disclosure.

FIG. 10 is a schematic diagram of a display panel according to an embodiment of the present disclosure. Compared with the display panel illustrated in FIG. 5, in the display panel illustrated in FIG. 10, the first signal line L1 located at the first side of the notch and the first signal line L1 located at the second side of the notch are connected through a connection line. The connecting line is located in the frame region. For example, the display pixel units in the vicinity of the notch is driven by a scan driving circuit, which is GOA (Gate driver On Array) mounted on the display panel, in a double-side driving mode.

Figure 11:
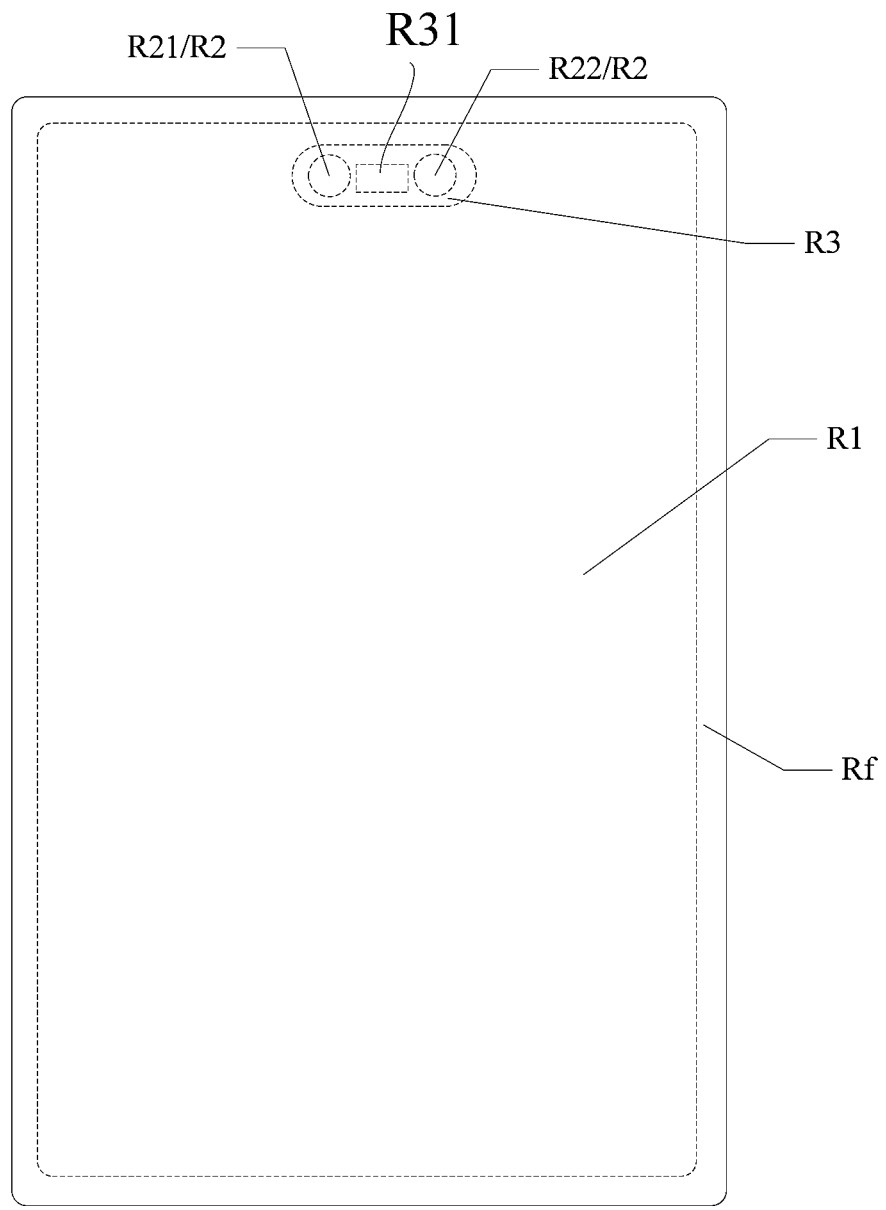
FIG. 11 is a schematic diagram of a display panel according to an embodiment of the present disclosure.

FIG. 11 is a schematic diagram of a display panel according to an embodiment of the present disclosure. As illustrated in FIG. 11, the display panel includes a display region R1, a light transmitting region R2, a frame region Rf, and a first dummy region R31. The frame region Rf surrounds the display region R1. The display region R1 surrounds the light transmitting region R2. The light-transmitting region R2 includes a through hole region, the through hole region includes a first through hole region R21 and a second through hole region R22, and the first dummy region R31 includes a portion between the first through hole region R21 and the second through hole region R22. For example, after the encapsulation layer is formed, a display panel with a through hole region is formed by cutting according to the outlines of the first through hole region R21 and the second through hole region R22.

Figure 12:
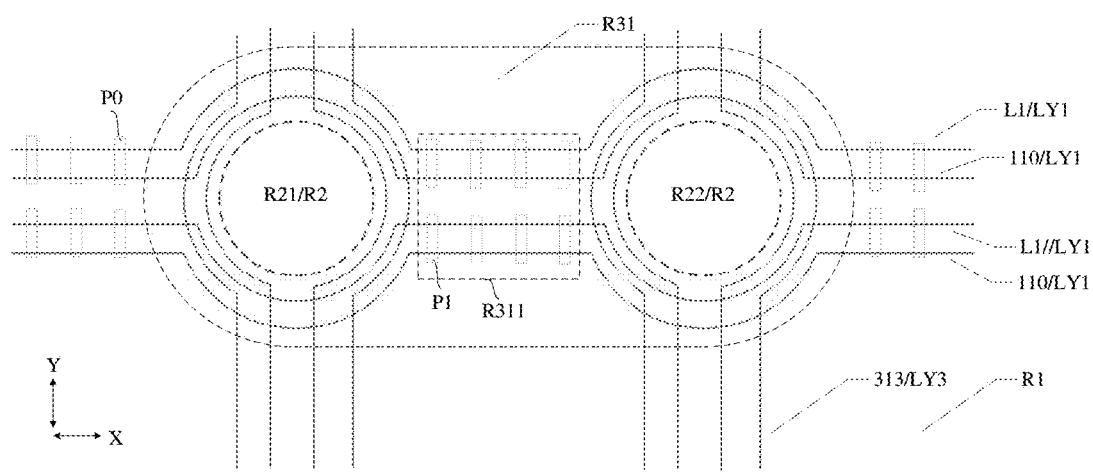
FIG. 12 is a partial view of FIG. 11.

FIG. 12 is a partial view of FIG. 11. The first dummy pixel unit P1 is located in the portion R311 of the first dummy region R31 between the first through hole region R21 and the second through hole region R22. FIG. 12 also illustrates a display pixel unit P0 located in the display region R1. FIG. 12 also illustrates a first signal line L1, a light emitting control signal line 110, and a data line 313. For example, the first signal line L1 and the light emitting control signal line 110 are located in a first conductive pattern layer LY1, and the data line 313 is located in a third conductive pattern layer LY3, which are not limited thereto.

For example, as illustrated in FIG. 12, a plurality of first signal lines L1 are provided, the plurality of first signal lines L1 extend along a first direction X, and the plurality of first signal lines L1 are arranged along a second direction Y, and the first direction X is intersected with the second direction Y. For example, in some embodiments, in the second direction Y, the loads of the first signal lines L1 decrease linearly and then increase linearly. Therefore, there is little difference in display brightness between adjacent two rows of display pixel units in the vicinity of the light transmitting region R2, and display defects, such as Mura, are avoided. Of course, the display panel can further include a plurality of other first signal lines L1 with uniform or substantially uniform loads away from the light transmitting region, in addition to the plurality of first signal lines L1 with linearly decreasing and then linearly increasing loads in the vicinity of the light transmitting region.

Figure 13:
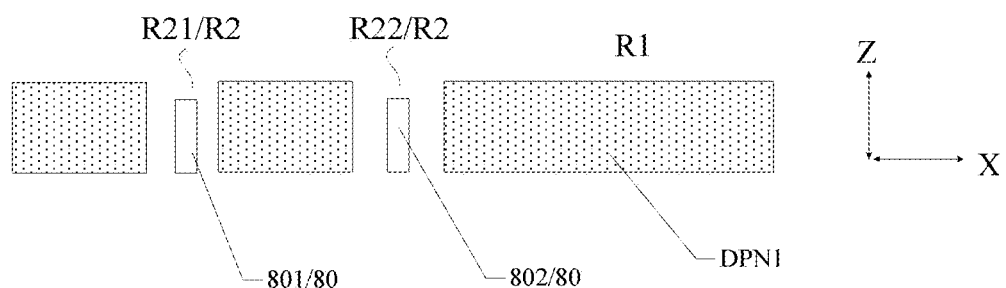
FIG. 13 is a partial view of a display panel according to an embodiment of the present disclosure.

FIG. 13 is a partial view of a display panel according to an embodiment of the present disclosure. As illustrated in FIG. 13, the display panel DPN1 has a light transmitting region R2, and the light transmitting region R2 includes a first through hole region R21 and a second through hole region R22. As illustrated in FIG. 13, the sensor 80 includes a first sensor 801 and a second sensor 802, the first sensor 801 is located in the first through hole region R21, and the second sensor 802 is located in the second through hole region R22. Referring to FIG. 12 and FIG. 13, the third direction Z is perpendicular to the first direction X and perpendicular to the second direction Y.

Figure 14:
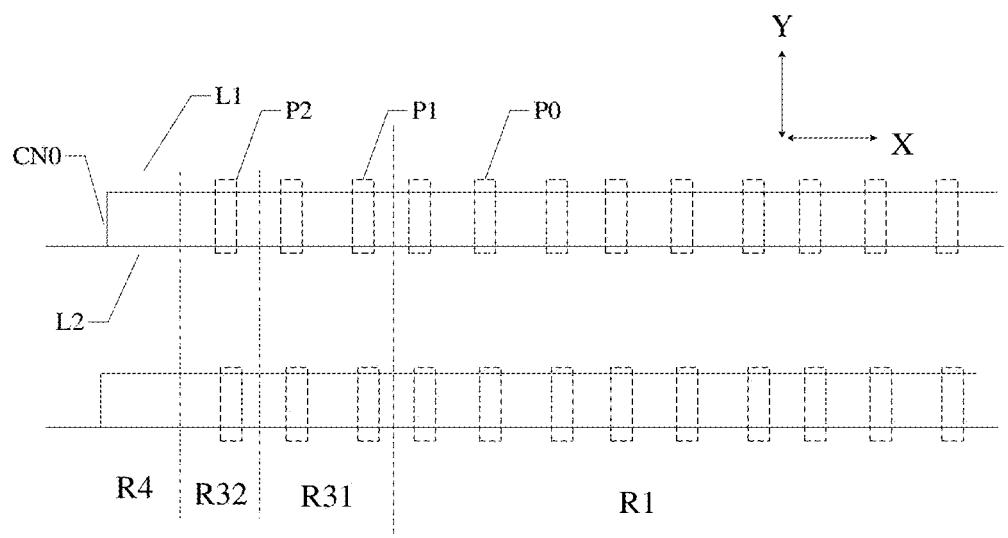
FIG. 14 is a partial view of a display panel according to an embodiment of the present disclosure.

FIG. 14 is a partial view of a display panel according to an embodiment of the present disclosure. For example, as illustrated in FIG. 14, the display panel further includes a second signal line L2 and a connection element CN0, the second signal line L2 has a same extending direction as the first signal line L1, the second signal line L2 and the first signal line L1 extend in the first direction X, and the second signal line L2 and the first signal line L1 are arranged in the second direction Y. The second signal line L2 is connected with the first signal line L1 through the connection element CN0, and the second signal line L2 is connected with the first dummy pixel unit P1. The connection element CN0 is located in a lead region R4. The lead region R4 is located at a side of the second dummy region R32 away from the display region R1. For example, the lead region R4 can be located on the left side and/or the right side of the display panel.

For example, the first signal line L1 includes a gate line, and the second signal line L2 includes a reset control signal line. For example, the first signal line L1 and the second signal line L2 are located in a same layer, for example, in a first conductive pattern layer, while the connection element CN0 is located in another layer, for example, in a third conductive pattern layer, and is connected with the first signal line L1 and the second signal line L2 respectively through via holes penetrating through an insulating layer. For example, the left side of the connection element CN0 in FIG. 14 is connected with the GOA circuit.

In the display panel provided by the embodiment of the present disclosure, the second signal line L2 is connected with the first signal line L1, and the second signal line L2 is connected with the first dummy pixel unit P1, thereby greatly increasing the load of the first signal line L1 and effectively reducing the missing load of the first signal line L1.

For example, in some embodiments of the present disclosure, the load formed by the first dummy pixel unit P1 connected with the first signal line L1 is smaller than the load missing from the first signal line L1 before compensation. That is, when compensation is performed, it is not that the compensated load is equal to the missing load before compensation, but it is that the compensated load of the first signal line L1 is smaller than the missing load of the first signal line L1 before compensation.

For example, the missing load of the first signal line L1 before compensation can be obtained by the number of display pixel units that can be set in the light transmitting region of the display pixel unit row. Or, the missing load of the first signal line L1 before compensation can be obtained by the load of the first signal line L1 under condition of not setting the light transmitting region and the load of the first signal line L1 under condition of setting the light transmitting region. The missing load of the first signal line L1 before compensation can be obtained by subtracting the load of the first signal line L1 under condition of setting the light transmitting region from the load of the first signal line L1 under condition of not setting the light transmitting region, but is not limited thereto.

The load includes capacitance. For example, the missing load of the first signal line L1 before compensation can be obtained by simulation or calculation, for example, according to the number of display pixel units, the number of missing display pixel units and the formula of capacitance. According to the formula of capacitance, the capacitance is related to the distance between two plates, the facing area between the two plates and the dielectric constant of the dielectric between the two plates, etc.

For example, in some embodiments of the present disclosure, in order to improve the display quality, the load formed by the first dummy pixel unit P1 connected with the first signal line L1 is 65%-80% of the load missing from the first signal line L1 before compensation.

For example, in some embodiments of the present disclosure, in order to improve the display quality, the load formed by the first dummy pixel unit P1 connected with the first signal line L1 is 70% of the load missing from the first signal line L1 before compensation.

Figure 15:
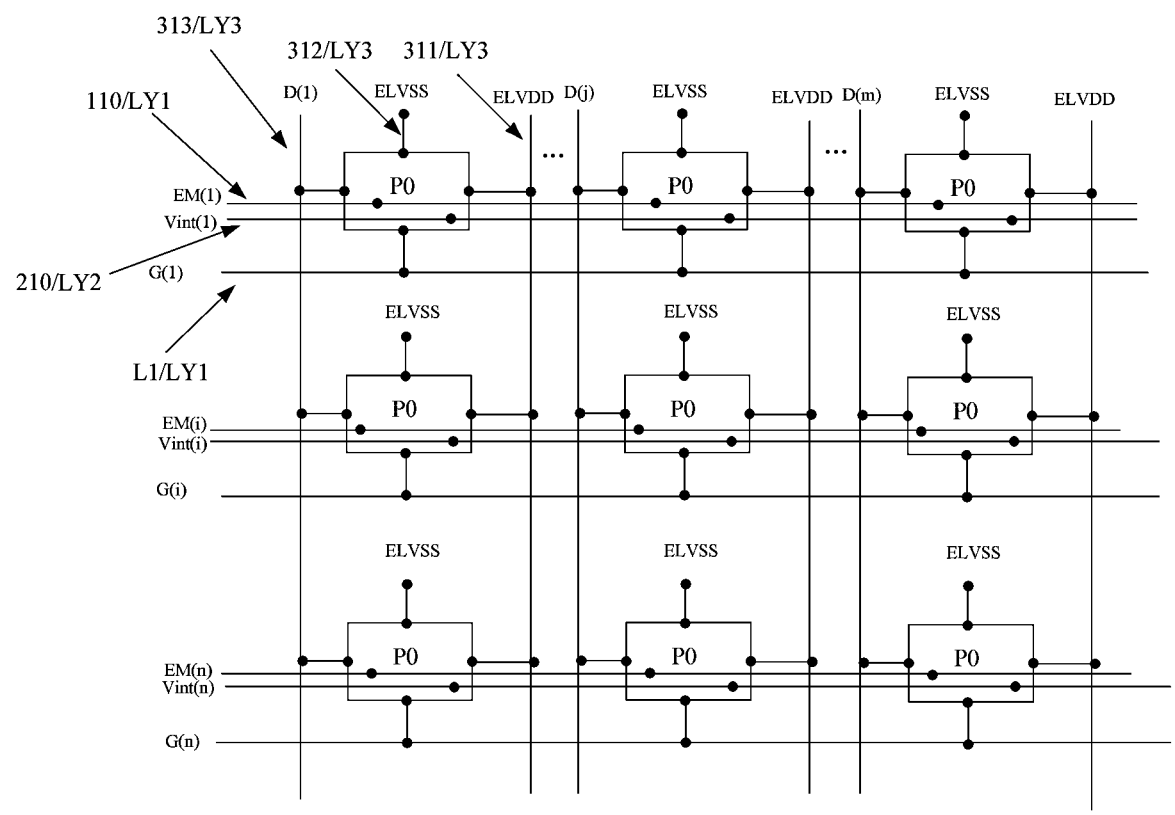
FIG. 15 is a schematic diagram of signal lines used to provide signals for each display pixel unit in a display panel according to an embodiment of the present disclosure.
Figure 16:
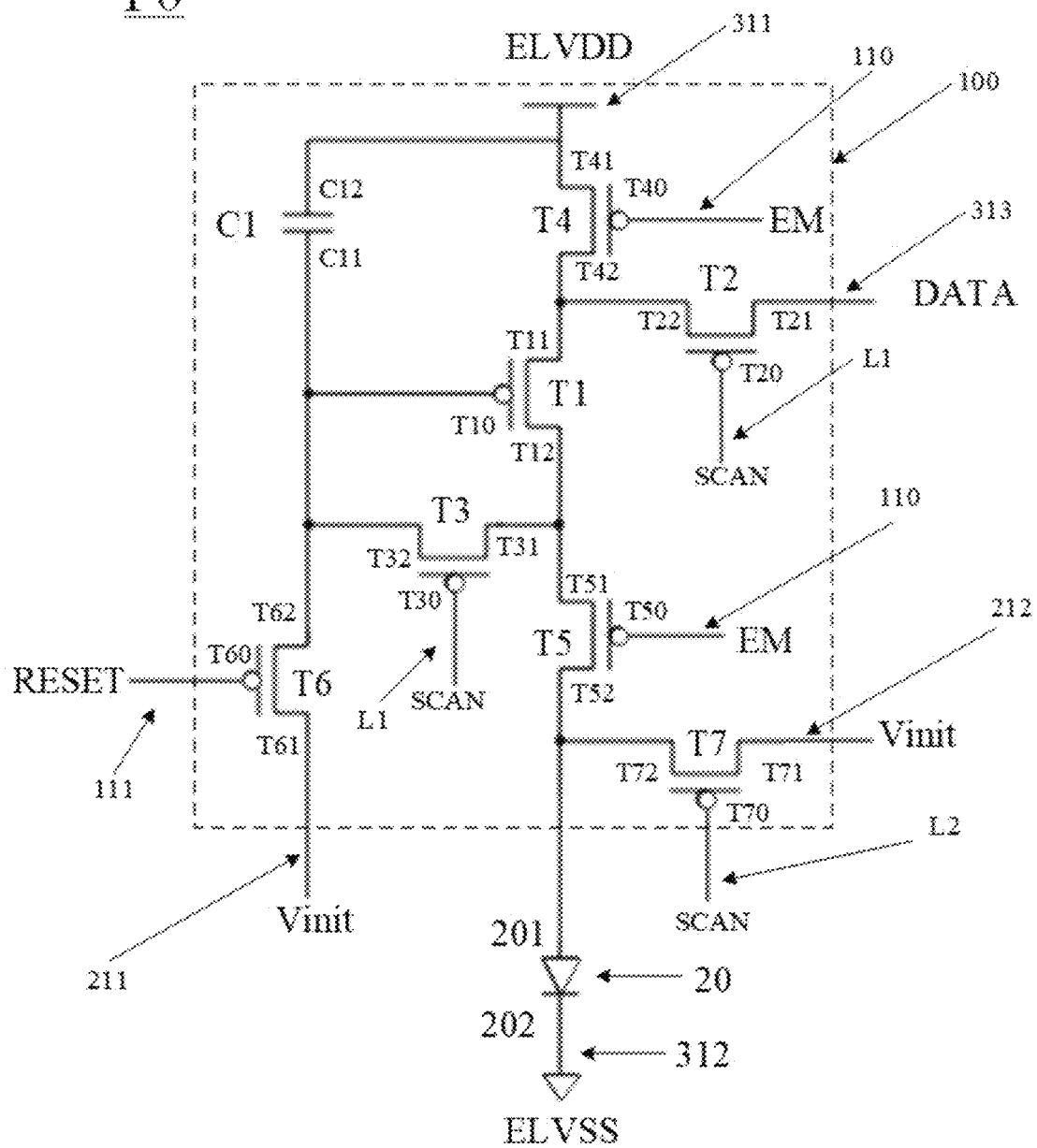
FIG. 16 is a schematic diagram of a display pixel circuit structure of a display panel according to an embodiment of the present disclosure.
Figure 17:
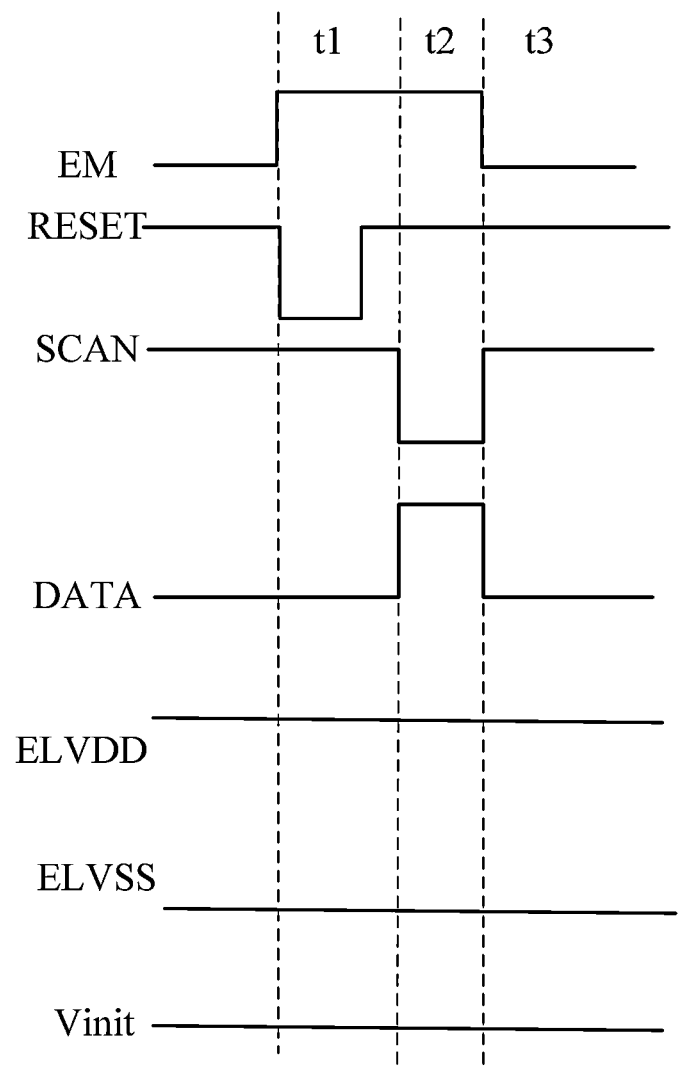
FIG. 17 is a timing signal diagram of a display pixel unit in a display panel according to an embodiment of the present disclosure.
Figure 18:
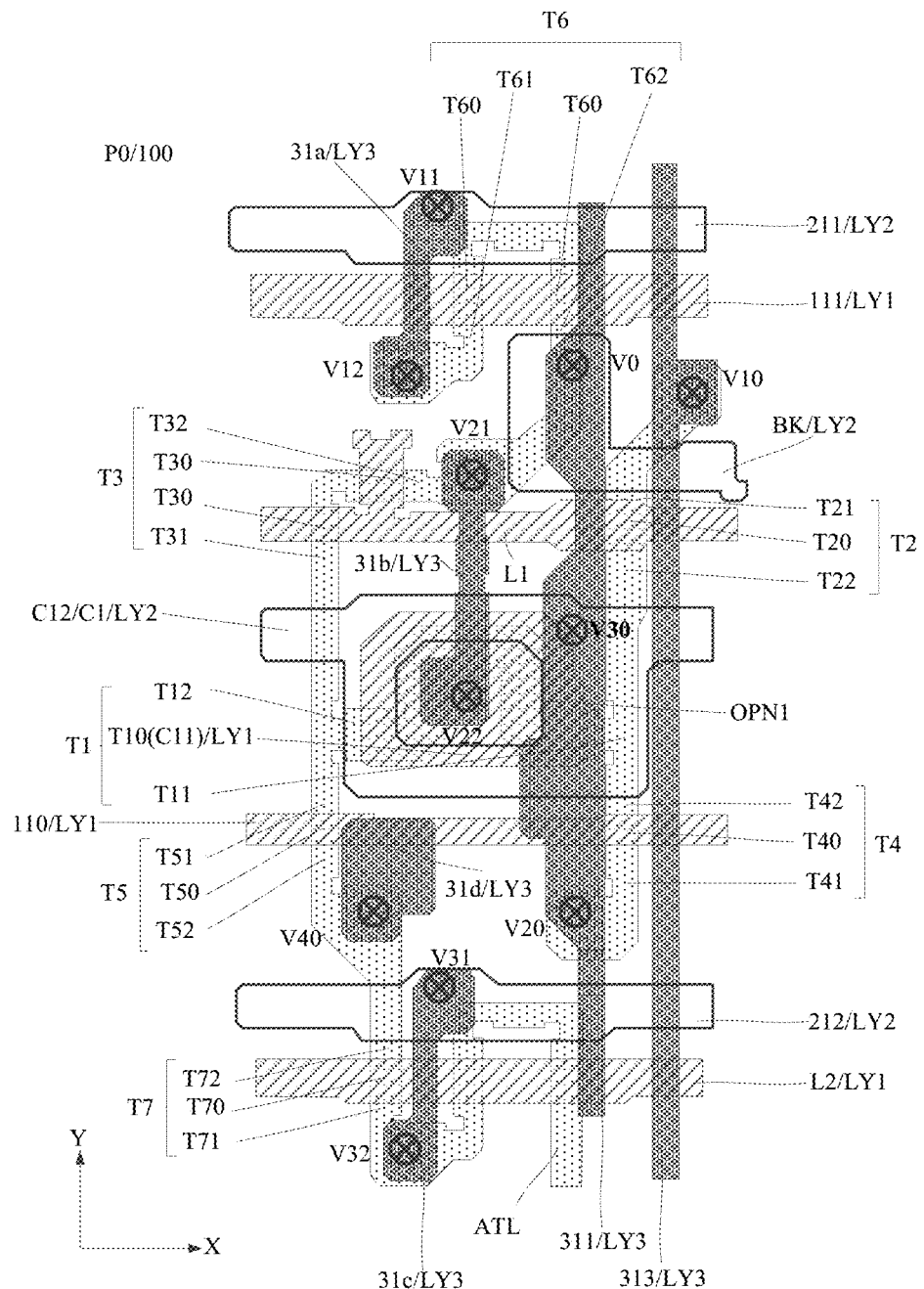
FIG. 18 is a plan view of display pixel circuit structure of a display pixel unit according to an embodiment of the present disclosure.
Figure 19:
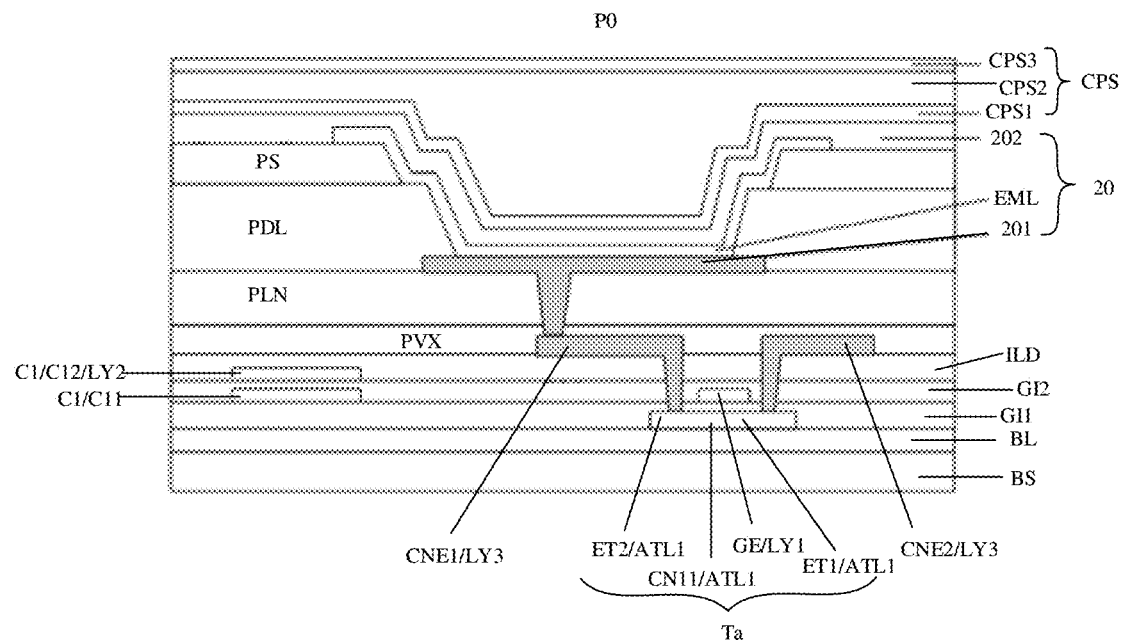
FIG. 19 is a cross-sectional view of a display pixel unit of a display panel according to an embodiment of the present disclosure.

FIG. 15 is a schematic diagram of signal lines used to provide signals for each display pixel unit in a display panel according to an embodiment of the present disclosure. FIG. 16 is a schematic diagram of a display pixel circuit structure of a display panel according to an embodiment of the present disclosure. FIG. 17 is a timing signal diagram of a display pixel unit in a display panel according to an embodiment of the present disclosure. FIG. 18 is a plan view of display pixel circuit structure of a display pixel unit according to an embodiment of the present disclosure. FIG. 19 is a cross-sectional view of a display pixel unit of a display panel according to an embodiment of the present disclosure.

Referring to FIG. 15 and FIG. 16, each display pixel unit P0 includes a light emitting element 20 and a display pixel circuit structure 100 that provides a driving current for the light emitting element 20, the light emitting element 20 can be an electroluminescent element, for example, an organic electroluminescent element, such as an organic light emitting diode (OLED). The display pixel unit P0 is a pixel unit that emits light normally. The display pixel unit P0 is located in the display region R1.

FIG. 15 illustrates a first signal line L1, a data line 313, a first power line 311, a second power line 312, a light emitting control signal line 110 and an initialization signal line 210. FIG. 16 further illustrates a second signal line L2 and a reset control signal line 111, and the second signal line L2 is configured to provide a reset control signal RESET to the display pixel circuit structure 100. The reset control signal line 111 is configured to provide a reset control signal RESET to the display pixel circuit structure 100.

For example, referring to FIG. 15 and FIG. 16, the first signal line L1 is configured to provide a scan signal SCAN to the display pixel circuit structure. The light emitting control signal line 110 is configured to provide a light emitting control signal EM to the display pixel unit P0. The data line 313 is configured to provide a data signal DATA to the display pixel circuit structure 100, the first power line 311 is configured to provide a constant first voltage signal ELVDD to the display pixel circuit structure 100, the second power line 312 is configured to provide a constant second voltage signal ELVSS to the display pixel circuit structure 100, and the first voltage signal ELVDD is higher than the second voltage signal ELVSS. The initialization signal line 210 is configured to provide an initialization signal Vint to the display pixel circuit structure 100. The initialization signal Vint is a constant voltage signal, and the magnitude thereof can be between the first voltage signal ELVDD and the second voltage signal ELVSS, but is not limited to this case. For example, the initialization signal Vint can be less than or equal to the second voltage signal ELVSS. For example, the display pixel circuit structure outputs a driving current to drive the light emitting element to emit light under the control of signals such as the scan signal SCAN, the data signal DATA, the initialization signal Vint, the first voltage signal ELVDD, the second voltage signal ELVSS, and the light emitting control signal EM, etc.

For example, as illustrated in FIG. 18, the reset control signal line 111, the first signal line L1, the light emitting control signal line 110, the second signal line L2 and a first electrode C11 of the storage capacitor C1 are located in the first conductive pattern layer LY1; the first initialization signal line 211, the second initialization signal line 212, the conductive block BK and the second electrode C12 of the storage capacitor C1 are located in the second conductive pattern layer LY2; the first connection electrode 31a, the second connection electrode 31b, the third connection electrode 31c, the fourth connection electrode 31d, the data line 313 and the first power line 311 are located in the third conductive pattern layer LY3. The second power line 312 can also be located in the third conductive pattern layer LY3.

Referring to FIG. 18 and FIG. 19, the display panel further includes an active layer ATL, a first gate insulating layer GI1 is disposed between the active layer ATL and the first conductive pattern layer LY1, a second gate insulating layer GI2 is disposed between the first conductive pattern layer LY1 and the second conductive pattern layer LY2, and an interlayer insulating layer ILD is disposed between the second conductive pattern layer LY2 and the third conductive pattern layer LY3.

For example, the display panel includes a plurality of display pixel units P0, and the plurality of display pixel units P0 can be arranged in an array. Each display pixel unit P0 includes a display pixel circuit structure 100, a light emitting element 20, a first signal line L1, a data line 313 and a voltage signal line. For example, the light emitting element 20 is an organic light emitting diode (OLED), and the light emitting element 20 emits red light, green light, blue light, or white light under drive of a corresponding display pixel circuit structure 100. The voltage signal line can be one or multiple. For example, as illustrated in FIG. 15 and FIG. 16, the voltage signal line includes at least one of a first power line 311, a second power line 312, a light emitting control signal line 110, a first initialization signal line 211, a second initialization signal line 212, a reset control signal line 111, a second signal line L2, and the like. The first signal line L1 is configured to provide a scan signal SCAN to the display pixel circuit structure 100. The data line 313 is configured to provide a data signal DATA to the display pixel circuit structure 100. For example, one pixel includes a plurality of display pixel units. One pixel can include a plurality of display pixel units which emit light of different colors. For example, one pixel includes a display pixel unit emitting red light, a display pixel unit emitting green light and a display pixel unit emitting blue light, but is not limited to this case. The number of display pixel units included in one pixel and the light emitting condition of each display pixel unit can be determined as needed.

For example, the structure of the first dummy pixel unit P1 is the same as the structure of the display pixel circuit structure 100. For example, the pixel definition layer is not provided with an opening in the first dummy region R31, and/or the first electrode of the light emitting element is not provided in the first dummy region R31, so that the first dummy pixel unit P1 does not emit light.

For example, the structure of the second dummy pixel unit P2 is formed by reducing the line structure of the display pixel unit P0. For example, the pixel circuit of the second dummy pixel unit P2 is incomplete, the pixel definition layer is not provided with an opening in the second dummy region R32, and/or the first electrode of the light emitting element is not provided for the second dummy area R32, so that the second dummy pixel unit P2 does not emit light. The pixel circuit of the second dummy pixel unit P2 being incomplete includes the case that the pixel circuit of the second dummy pixel unit P2 does not have at one element or component in the display pixel circuit structure 100.

For example, the first power line 311 is configured to provide a constant first voltage signal ELVDD to the display pixel circuit structure 100, the second power line 312 is configured to provide a constant second voltage signal ELVSS to the display pixel circuit structure 100, and the first voltage signal ELVDD is higher than the second voltage signal ELVSS. The light emitting control signal line 110 is configured to provide a light emitting control signal EM to the display pixel circuit structure 100. The first initialization signal line 211 and the second initialization signal line 212 are configured to provide an initialization signal Vint to the display pixel circuit structure 100, the reset control signal line 111 is configured to provide a reset control signal RESET to the display pixel circuit structure 100, and the second signal line L2 is configured to provide a scan signal SCAN to the display pixel circuit structure 100. The initialization signal Vint is a constant voltage signal, and the magnitude thereof can be between the first voltage signal ELVDD and the second voltage signal ELVSS, but is not limited to this case. For example, the initialization signal Vint can be less than or equal to the second voltage signal ELVSS.

As illustrated in FIG. 16 and FIG. 18, the display pixel circuit structure 100 includes a driving transistor T1, a data writing transistor T2, a threshold compensation transistor T3, a first light emitting control transistor T4, a second light emitting control transistor T5, a first reset transistor T6, a second reset transistor T7 and a storage capacitor C1. The driving transistor T1 is electrically connected with the light emitting element 20, and outputs a driving current to drive the light emitting element 20 to emit light under the control of signals, such as a scan signal SCAN, a data signal DATA, a first voltage signal ELVDD, a second voltage signal ELVSS, etc.

In a pixel unit of an organic light emitting diode display panel, the driving transistor is connected with an organic light emitting element, and outputs a driving current to the organic light emitting element under the control of signals, such as a data signal, a scan signal, etc., thereby driving the organic light emitting element to emit light.

For example, the display panel provided by the embodiment of the present disclosure further includes a data driving circuit and a scan driving circuit. The data driving circuit is configured to provide a data signal DATA to the display pixel unit P0 according to an instruction of a control circuit; the scan driving circuit is configured to provide signals such as, a light emitting control signal EM, a scan signal SCAN, a reset control signal RESET, etc., to the display pixel unit P0 according to an instruction of the control circuit. For example, the control circuit includes an external integrated circuit (IC), but is not limited thereto. For example, the scan driving circuit is a GOA (Gate driver On Array) structure mounted on the display panel, or a driver chip (IC) structure bonding to the display panel. For example, different driving circuits can also be used to provide the light emitting control signal EM and the scan signal SCAN, respectively. For example, the display panel further includes a power source (not illustrated in the figure), which can be a voltage source or a current source as needed, and the power source is configured to provide a first voltage signal ELVDD, a second power voltage ELVSS and an initialization signal Vint to the display pixel unit P0 through the first power line 311, the second power line 312, and the initialization signal line (the first initialization signal line 211 and the second initialization signal line 212), respectively.

As illustrated in FIG. 16 and FIG. 18, the second electrode C12 of the storage capacitor C1 is electrically connected with the first power line 311, and the first electrode C11 of the storage capacitor C1 is electrically connected with the second electrode T32 of the threshold compensation transistor T3. The gate electrode T20 of the data writing transistor T2 is electrically connected with the first signal line L1, and the first electrode T21 and the second electrode T22 of the data writing transistor T2 are respectively electrically connected with the data line 313 and the first electrode T11 of the driving transistor T1. The gate electrode T30 of the threshold compensation transistor T3 is electrically connected with the first signal line L1, the first electrode T31 of the threshold compensation transistor T3 is electrically connected with the second electrode T12 of the driving transistor T1, and the second electrode T32 of the threshold compensation transistor T3 is electrically connected with the gate electrode T10 of driving transistor T1.

For example, as illustrated in FIG. 16 and FIG. 18, the gate electrode T40 of the first light emitting control transistor T4 and the gate electrode T50 of the second light emitting control transistor T5 are both connected with the light emitting control signal line 110.

For example, as illustrated in FIG. 16 and FIG. 18, the first electrode T41 and the second electrode T42 of the first light emitting control transistor T4 are respectively electrically connected with the first power line 311 and the first electrode T11 of the driving transistor T1. The first electrode T51 and the second electrode T52 of the second light emitting control transistor T5 are respectively electrically connected with the second electrode T12 of the driving transistor T1 and the first electrode 201 of the light emitting element 20. The second electrode 202 of the light emitting element 20 (which may be a common electrode of the OLED, such as a cathode) is electrically connected with the second power line 312.

For example, as illustrated in FIG. 16 and FIG. 18, the gate electrode T60 of the first reset transistor T6 is electrically connected with the reset control signal line 111, the first electrode T61 of the first reset transistor T6 is electrically connected with the first initialization signal line 211, and the second electrode T62 of the first reset transistor T6 is electrically connected with the gate electrode T10 of the driving transistor T1. The gate electrode T70 of the second reset transistor T7 is electrically connected with the second signal line L2, the first electrode T71 of the second reset transistor T7 is electrically connected with the second initialization signal line 212, and the second electrode T72 of the second reset transistor T7 is electrically connected with the first electrode 201 of the light emitting element 20.

For example, as illustrated in FIG. 18, the first connection electrode 31a, the second connection electrode 31b, the third connection electrode 31c, the fourth connection electrode 31d, the data line 313 and the first power line 311 are located in the same layer. Therefore, the data line 313 is electrically connected with the first electrode T21 of the data writing transistor T2 through the via hole V10, the first power line 311 is electrically connected with the first electrode T41 of the first light emitting control transistor T4 through the via hole V20, the first power line 311 is electrically connected with the second electrode C12 of the storage capacitor C1 through the via hole V30, and the first power line 311 is electrically connected with the conductive block BK through the via hole V0. One end of the first connection electrode 31a is electrically connected with the first initialization signal line 211 through the via hole V11, and the other end of the first connection electrode 31a is electrically connected with the first electrode T61 of the first reset transistor T6 through the via hole V12, so that the first electrode T61 of the first reset transistor T6 is electrically connected with the first initialization signal line 211. One end of the second connection electrode 31b is electrically connected with the second electrode T62 of the first reset transistor T6 through the via hole V21, and the other end of the second connection electrode 31b is electrically connected with the gate electrode T10 of the driving transistor T1 (i.e., the first electrode C11 of the storage capacitor C1) through the via hole V22, so that the second electrode T62 of the first reset transistor T6 is electrically connected with the gate electrode T10 of the driving transistor T1 (i.e., the first electrode C11 of the storage capacitor C1). One end of the third connection electrode 31c is electrically connected with the second initialization signal line 212 through the via hole V31, and the other end of the third connection electrode 31c is electrically connected with the first electrode T71 of the second reset transistor T7 through the via hole V32, so that the first electrode T71 of the second reset transistor T7 is electrically connected with the second initialization signal line 212. The fourth connection electrode 31d is electrically connected with the second electrode T52 of the second light emitting control transistor T5 through the via hole V40. The fourth connection electrode 31d can be configured to be electrically connected with the first electrode 201 of the light emitting element 20 formed later (referring to FIG. 6).

It should be noted that the transistors adopted in one embodiment of the present disclosure can be thin film transistors, field effect transistors or other switching elements with the same characteristics. The source electrode and the drain electrode of the transistor used here can be symmetrical in structure, so there may be no difference in structure between the source electrode and the drain electrode. In an embodiment of the present disclosure, in order to distinguish the two electrodes of the transistor other than the gate electrode, it is directly described that one electrode is the first electrode and the other electrode is the second pole, so the first electrode and the second electrode of all or part of the transistors in the embodiment of the present disclosure can be interchanged as needed. For example, in the embodiment of the present disclosure, the first electrode of the transistor described can be a source electrode and the second electrode of the transistor can be a drain electrode; or, the first electrode of the transistor is the drain electrode and the second electrode is the source electrode.

In addition, transistors can be divided into N-type and P-type transistors according to the characteristics of transistors. The embodiments of the present disclosure are described by taking that the transistors are p-type transistors as an example. Based on the description and teaching of this implementation in the present disclosure, those skilled in the art can easily conceive an implementation in which at least some transistors in the display pixel circuit structure of the embodiment of the present disclosure are N-type transistors, that is, N-type transistors or a combination of N-type transistors and P-type transistors are adopted. Therefore, these implementations are also within the protection scope of the present disclosure.

The display pixel circuit of the display substrate illustrated in FIG. 3 and FIG. 5 can be that as illustrated in FIG. 16. The embodiments of the present disclosure are described by taking that the pixel circuit of the display panel has a 7T1C structure as an example, but are not limited to this case. The pixel circuit of the display panel can also be a structure including other numbers of transistors, such as a 7T2C structure, a 6T1C structure, a 6T2C structure or a 9T2C structure, without being limited in the embodiments of the present disclosure.

FIG. 19 is a cross-sectional view of a display panel according to an embodiment of the present disclosure. For example, as illustrated in FIG. 19, the display panel includes a thin film transistor Ta and a storage capacitor C1. The thin film transistor Ta is the second light emitting control transistor T5 described above. The thin film transistor Ta includes an active layer ATL1 on the base substrate BS, a first gate insulating layer GI1 at a side of the active layer ATL1 away from the base substrate BS, and a gate electrode GE at a side of first gate insulating layer GI1 away from the base substrate BS. The display panel further includes a second gate insulating layer GI2 at a side of the gate electrode GE away from the base substrate BS, an interlayer insulating layer ILD at a side of the second gate insulating layer GI2 away from the base substrate BS, and connection electrodes CNE1 and CNE2 at a side of the interlayer insulating layer ILD away from the base substrate BS. The active layer ATL1 includes a channel CN11, and a first electrode ET1 and a second electrode ET2 located at both sides of the channel CN11, the connection electrode CNE1 is connected with the second electrode ET2 through a via hole penetrating through the first gate insulating layer GIL the second gate insulating layer GI2 and the interlayer insulating layer ILD, and the connection electrode CNE2 is connected with the first electrode ET1. The storage capacitor C1 includes a first electrode C11 and a second electrode C12; the first electrode C11 and the gate electrode GE are located in a same layer, and both are located in the first conductive pattern layer LY1; and the second electrode C12 is located between the second gate insulating layer GI2 and the interlayer insulating layer ILD and in the second conductive pattern layer LY2. One of the first electrode ET1 and the second electrode ET2 is a source electrode, and the other of the first electrode ET1 and the second electrode ET2 is a drain electrode. The connection electrode CNE1 and the connection electrode CNE2 are located in the third conductive pattern layer LY3. The display panel further includes a passivation layer PVX and a planarization layer PLN. For example, the connection electrode CNE1 and the connection electrode CNE2 can be the fourth connection electrode 31d and the second connection electrode 31b as described above, respectively.

As illustrated in FIG. 19, the display panel further includes a light emitting element 20, the light emitting element 20 includes a first electrode 201, a light emitting functional layer EML and a second electrode 202, and the first electrode 201 is connected with the connection electrode CNE1 through a via hole penetrating through the passivation layer PVX and the planarization layer PLN. The display panel further includes an encapsulation layer CPS, the encapsulation layer CPS includes a first encapsulation layer CPS1, a second encapsulation layer CPS2 and a third encapsulation layer CPS3. For example, the first encapsulation layer CPS1 and the third encapsulation layer CPS3 are inorganic material layers, and the second encapsulation layer CPS2 is an organic material layer. For example, the first electrode 201 is an anode and the second electrode 202 is a cathode, which is not limited thereto.

The light emitting element 20 includes an organic light emitting diode. The light emitting functional layer is located between the second electrode 202 and the first electrode 201. The light emitting functional layer EML at least includes a light emitting layer, and can further includes at least one of a hole transport layer, a hole injection layer, an electron transport layer and an electron injection layer.

As illustrated in FIG. 19, the display panel further includes a pixel definition layer PDL and a spacer PS. The pixel definition layer PDL has an opening, and the opening is configured to define the light emitting area (light exiting region) of the display pixel unit, and the spacer PS is configured to support the fine metal mask when forming the light emitting functional layer EML. FIG. 19 illustrates that the spacers PS are provided at opposite sides of the light emitting element. For example, the spacer PS is provided between adjacent display pixel units, but not limited to this case. In some other embodiments, not all positions between adjacent display units are provided the spacer PS.

For example, one of the anode and the cathode of the light emitting element 20 is electrically connected with the driving transistor, and the driving transistor is configured to provide a driving current for driving the light emitting element 20 to emit light.

For example, the data line is configured to input a data signal to the display pixel unit, and the first power signal line is configured to input a first power voltage to the driving transistor. The second power signal line is configured to input a second power voltage to the display pixel unit. The first power voltage is a constant voltage and the second power supply voltage is a constant voltage. For example, the first power voltage is a positive voltage and the second power voltage is a negative voltage, which is not limited to this case. For example, in some embodiments, the first power voltage is a positive voltage and the second power signal line is grounded.

Hereinafter, the driving method of one display pixel unit in the display panel provided by the embodiment of the present disclosure will be described with reference to FIG. 16 and FIG. 17.

As illustrated in FIG. 17, in a frame display period, the driving method of the display pixel unit includes a first reset stage t1, a data writing, threshold compensation and second reset stage t2, and a light emitting stage t3.

In the first reset stage t1, the light emitting control signal EM is set to be a turn-off voltage, the reset control signal RESET is set to be a turn-on voltage, and the scan signal SCAN is set to be a turn-off voltage.

In the data writing, threshold compensation and second reset stage t2, the light emitting control signal EM is set to be a turn-off voltage, the reset control signal RESET is set to be a turn-off voltage, and the scan signal SCAN is set to be a turn-on voltage.

In the light emitting stage t3, the light emitting control signal EM is set to be a turn-on voltage, the reset control signal RESET is set to be a turn-off voltage, and the scan signal SCAN is set to be a turn-off voltage.

As illustrated in FIG. 17, the first voltage signal ELVDD, the second voltage signal ELVSS and the initialization signal Vint are all constant voltage signals, and the initialization signal Vint is between the first voltage signal ELVDD and the second voltage signal ELVSS.

For example, in the embodiment of the present disclosure, the turn-on voltage refers to a voltage that can turn on the first electrode and the second electrode of a corresponding transistor, and the turn-off voltage refers to a voltage that can turn off the first electrode and the second electrode of a corresponding transistor. In the case where the transistor is a P-type transistor, the turn-on voltage is low voltage (for example, 0V), and the turn-off voltage is high voltage (for example, 5V). In the case where the transistor is an N-type transistor, the turn-on voltage is a high voltage (for example, 5V), and the turn-off voltage is a low voltage (for example, 0V). The driving waveforms illustrated in FIG. 17 are all illustrated by taking P-type transistors as an example, that is, the turn-on voltage is low voltage (for example, 0V) and the turn-off voltage is high voltage (for example, 5V).

Referring to FIG. 16 and FIG. 17, in the first reset stage t1, the light emitting control signal EM is at a turn-off voltage, the reset control signal RESET is at a turn-on voltage, and the scan signal SCAN is at a turn-off voltage. At this time, the first reset transistor T6 is in an on state, while the data writing transistor T2, the threshold compensation transistor T3, the first light emitting control transistor T4 and the second light emitting control transistor T5 are in an off state. The first reset transistor T6 transmits the initialization signal (initialization voltage) Vint to the gate electrode of the driving transistor T1 and the initialization signal Vint is stored by the storage capacitor C1, thus resetting the driving transistor T1 and erasing the data stored during a previous light emitting period (a previous frame).

In the data writing, threshold compensation and second reset stage t2, the light emitting control signal EM is at a turn-off voltage, the reset control signal RESET is at a turn-off voltage, and the scan signal SCAN is at a turn-on voltage. At this time, the data writing transistor T2 and the threshold compensation transistor T3 are in an on state, the second reset transistor T7 is in an on state, and the second reset transistor T7 transmits the initialization signal Vint to the first electrode of the light emitting element 20 to reset the light emitting element 20; and the first light emitting control transistor T4, the second light emitting control transistor T5 and the first reset transistor T6 are in an off state. At this time, the data writing transistor T2 transmits a data signal voltage VDATA to the first electrode of the driving transistor T1, that is, the data writing transistor T2 receives the scan signal SCAN and the data signal DATA, and writes the data signal DATA into the first electrode of the driving transistor T1 according to the scan signal SCAN. The threshold compensation transistor T3 is turned on to connect the driving transistor T1 into a diode structure, so that the gate electrode of the driving transistor T1 can be charged. After the charging is completed, the gate voltage of the driving transistor T1 is VDATA+Vth, where VDATA is the data signal voltage and Vth is the threshold voltage of the driving transistor T1, that is, the threshold compensation transistor T3 receives the scan signal SCAN and performs threshold voltage compensation on the gate voltage of the driving transistor T1 according to the scan signal SCAN. In this stage, the voltage difference across the storage capacitor C1 is ELVDD-VDATA-Vth.

In the light emitting stage t3, the light emitting control signal EM is at a turn-on voltage, the reset control signal RESET is at a turn-off voltage, and the scan signal SCAN is at a turn-off voltage. The first light emitting control transistor T4 and the second light emitting control transistor T5 are in an on state, while the data writing transistor T2, the threshold compensation transistor T3, the first reset transistor T6 and the second reset transistor T7 are in an off state. The first voltage signal ELVDD is transmitted to the first electrode of the driving transistor T1 through the first light emitting control transistor T4, the gate voltage of the driving transistor T1 is kept at VDATA+Vth, and the light emitting current I flows into the light emitting element 20 through the first light emitting control transistor T4, the driving transistor T1 and the second light emitting control transistor T5, and the light emitting element 20 emits light. That is, the first light emitting control transistor T4 and the second light emitting control transistor T5 receive the light emitting control signal EM and control the light emitting element 20 to emit light according to the light emitting control signal EM. The light emitting current I satisfies the following saturation current formula:

$$K(Vgs-Vth)^2=K(VDATA+Vth-ELVDD-Vth)^2=K(VDATA-ELVDD)^2$$

where $$K = 0.5\mu_n Cox\frac{W}{L},$$

$\mu_n$ is the channel mobility of the driving transistor, Cox is the channel capacitance per unit area of the driving transistor T1, W and L are the channel width and channel length of the driving transistor T1, respectively, and Vgs is the voltage difference between the gate electrode and the source electrode (i.e., the first electrode of the driving transistor T1 in the present embodiment) of the driving transistor T1.

As can be seen from the above formula, the current flowing through the light emitting element 20 has nothing to do with the threshold voltage of the driving transistor T1. Therefore, the display pixel circuit structure perfectly compensates the threshold voltage of the driving transistor T1.

For example, the ratio of the duration of the light emitting stage t3 to the display period of one frame can be adjusted. In this way, the luminous brightness can be controlled by adjusting the ratio of the duration of the light emitting stage t3 to the display period of one frame. For example, by controlling the scan driving circuit 103 or an additional driving circuit in the display panel, the ratio of the duration of the light emitting stage t3 to the display period of one frame can be adjusted.

For example, in some other embodiments, the first reset transistor T6 or the second reset transistor T7 may not be provided, that is, the embodiments of the present disclosure are not limited to the specific pixel circuit illustrated in FIG. 6, and other pixel circuits that can realize compensation for the driving transistor may be adopted. Based on the description and teaching of this implementation in the present disclosure, other setting manners easily occur to those skilled in the art without any inventive work should belong to the protection scope of the present disclosure.

The manufacturing method of the display substrate illustrated in FIG. 18 is described below.

Figure 20:
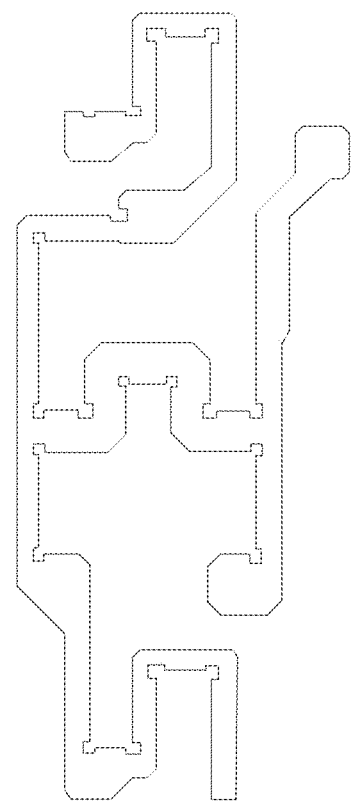
FIG. 20 is a schematic diagram of a semiconductor pattern layer formed in a manufacturing method of a display substrate according to an embodiment of the present disclosure.

FIG. 20 is a schematic diagram of a semiconductor pattern layer formed in a manufacturing method of a display substrate according to an embodiment of the present disclosure. The semiconductor pattern layer SCP is formed of a semiconductor material. The semiconductor materials include poly-silicon. A mask can be used to form the semiconductor pattern layer SCP. For example, the semiconductor pattern layer SCP can be lightly doped to adjust the threshold voltage of the thin film transistor. Light doping can adopt boron ions for doping.

The manufacturing method of the display substrate provided by one embodiment of the present disclosure further includes forming a first insulating thin film layer on the semiconductor pattern layer SCP. The first insulating thin film layer can adopt SiOx, but is not limited thereto.

Figure 21:
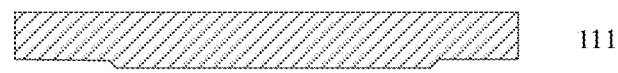
FIG. 21 is a schematic diagram of a first conductive pattern layer formed on a first insulating thin film layer in a manufacturing method of a display substrate according to an embodiment of the present disclosure.
Figure 21:
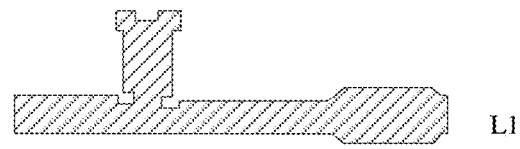
Figure 21:
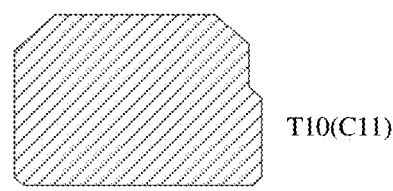
Figure 21:
Figure 21:
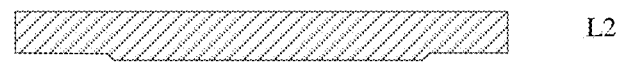

FIG. 21 is a schematic diagram of a first conductive pattern layer formed on a first insulating thin film layer in a manufacturing method of a display substrate according to an embodiment of the present disclosure. The first conductive pattern layer LY1 includes a light emitting control signal line 110, a reset control signal line 111, a second signal line L2, a first signal line L1, and the gate electrode T10 of the driving transistor T1. The gate electrode T10 of the driving transistor T1 also serves as the first electrode C11 of the storage capacitor C1. The material of the first conductive pattern layer LY1 includes metal, and the metal includes Molybdenum (Mo), but is not limited thereto.

Figure 22:
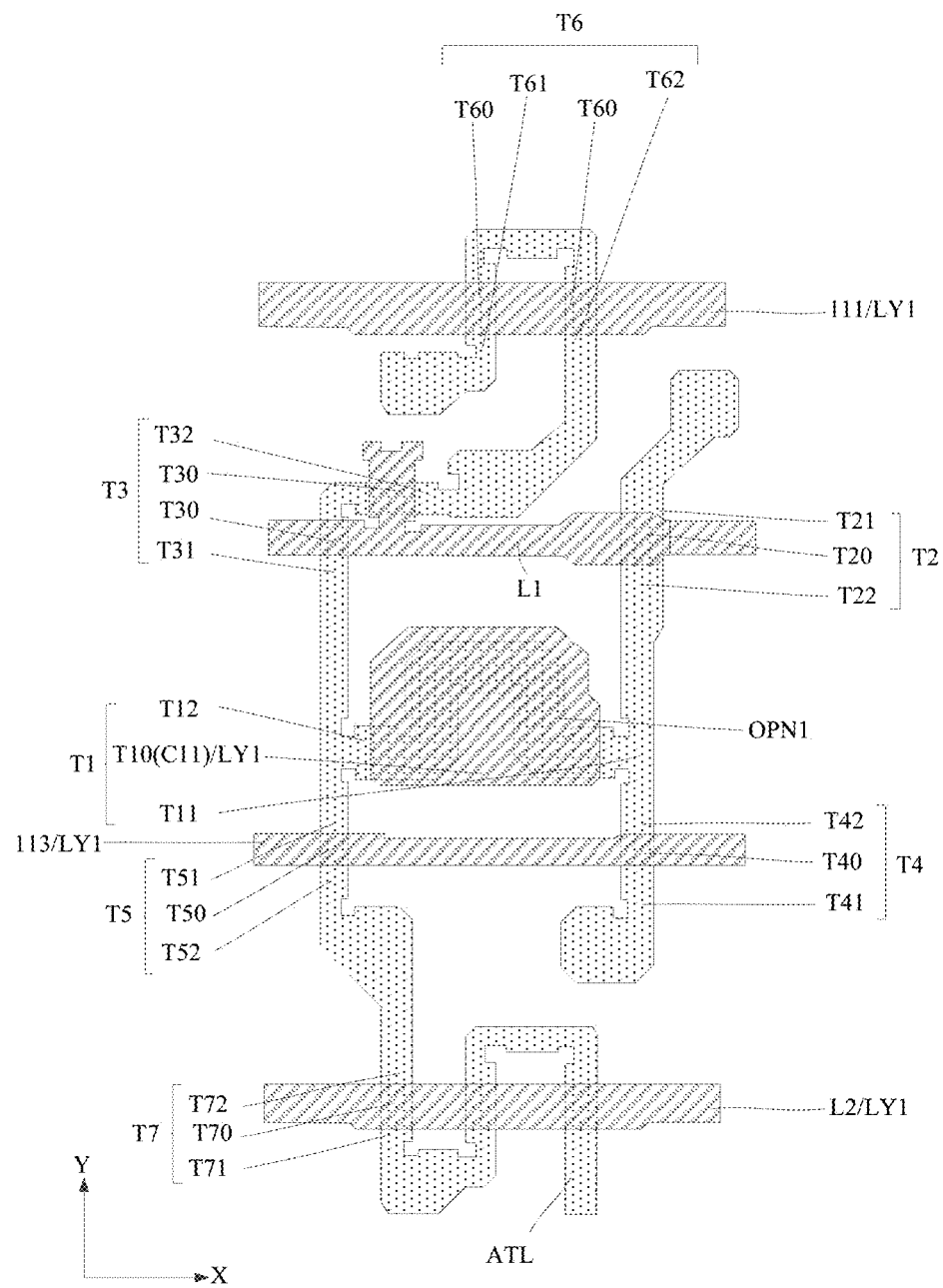
FIG. 22 is a schematic diagram of a structure after performing a conducting process on a semiconductor pattern layer by using a self-aligned technique in a manufacturing method of a display substrate according to an embodiment of the present disclosure.

FIG. 22 is a schematic diagram of a structure after performing a conducting process on a semiconductor pattern layer by using a self-aligned technique in a manufacturing method of a display substrate according to an embodiment of the present disclosure. The active layer ALT is formed after performing a conducting process on the semiconductor pattern layer by using a self-aligned technique. For example, in the manufacturing process of the display substrate, the semiconductor pattern layer SCP is subjected to a conducting process by using the self-aligned technique and taking the first conductive pattern layer LY1 as a mask, so as to form the active layer ATL. For example, the semiconductor pattern layer SCP is heavily doped by ion implantation; for example, a large amount of boron ions can be doped, so that the resistance of the part of the semiconductor pattern layer SCP that is not covered by the first conductive pattern layer LY1 is greatly reduced and has conductive characteristics, that is, it is conductive, thus forming a source region (first electrode T11) and a drain region (second electrode T12) of the driving transistor T1, a source region (first electrode T21) and a drain region (second electrode T22) of the data writing transistor T2, a source region (first electrode T31) and a drain region (second electrode T32) of the threshold compensation transistor T3, a source region (first electrode T41) and a drain region (second electrode T42) of the first light emitting control transistor T4, a source region (first electrode T51) and a drain region (second electrode T52) of the second light emitting control transistor T5, a source region (first electrode T61) and a drain region (second electrode T62) of the first reset transistor T6, and a source region (first electrode T71) and a drain region (second electrode T72) of the second reset transistor T7. Part of the semiconductor pattern layer SCP that is covered by the first conductive pattern layer LY1 retains semiconductor characteristics, thus forming a channel region T14 of the driving transistor t1, a channel region T24 of the data writing transistor T2, a channel region T34 of the threshold compensation transistor T3, a channel region T44 of the first light emitting control transistor T4, a channel region T54 of the second light emitting control transistor t5, a channel region T64 of the first reset transistor T6, and a channel region T74 of the second reset transistor T7. For example, as illustrated in FIG. 10, the second electrode T72 of the second reset transistor T7 and the second electrode T52 of the second light emitting control transistor T5 are integrally formed; the first electrode T51 of the second light emitting control transistor T5, the second electrode T12 of the driving transistor T1 and the first electrode T31 of the threshold compensation transistor T3 are integrally formed; the first electrode T11 of the driving transistor T1, the second electrode T22 of the data writing transistor T2 and the second electrode T42 of the first light emitting control transistor T4 are integrally formed; the second electrode T32 of the threshold compensation transistor T3 and the second electrode T62 of the first reset transistor T6 are integrally formed.

For example, as illustrated in FIG. 22, the gate electrode T40 of the first light emitting control transistor T4 is a part of the light emitting control signal line 110, the gate electrode T50 of the second light emitting control transistor T5 is a part of the first signal line L1, the gate electrode T20 of the data writing transistor T2 is a part of the first signal line L1, the gate electrode T30 of the threshold compensation transistor T3 is a part of the first signal line L1, the gate electrode T60 of the first reset transistor T6 is a part of the reset control signal line 111, and the gate electrode T70 of the second reset transistor T7 is a part of the second signal line L2.

For example, the channel region (active layer) of the transistor adopted in the embodiments of the present disclosure can be mono-crystalline silicon, polycrystalline silicon (e.g., low-temperature polycrystalline silicon) or a metal oxide semiconductor material (e.g., IGZO, AZO, etc.). In an embodiment, the transistors are all P-type low-temperature poly-silicon (LTPS) thin film transistors. In another embodiment, the threshold compensation transistor T3 and the first reset transistor T6 which are directly connected with the gate electrode of the driving transistor T1 are metal oxide semiconductor thin film transistors, that is, the channel materials of these transistors are a metal oxide semiconductor material (e.g., IGZO, AZO, etc.), and the metal oxide semiconductor thin film transistors have lower leakage current, which can help to reduce the gate leakage current of the driving transistor T1.

For example, the transistors adopted in the embodiments of the present disclosure can include various kinds of structures, such as top gate type, bottom gate type or double-gate structure. In an embodiment, the threshold compensation transistor T3 and the first reset transistor T6 which are directly connected with the gate electrode of the driving transistor T1 are double-gate thin film transistors, which can help to reduce the gate leakage current of the driving transistor T1.

In the manufacturing method of the display substrate provided by one embodiment of the present disclosure, a second insulating thin film layer is formed on the structure after performing the conducting process. The second insulating thin film layer is not illustrated in the figure. For example, the second insulating film layer can be in a planar shape and cover the base substrate. The material of the second insulating thin film layer includes SiNx, but is not limited thereto.

Figure 23:
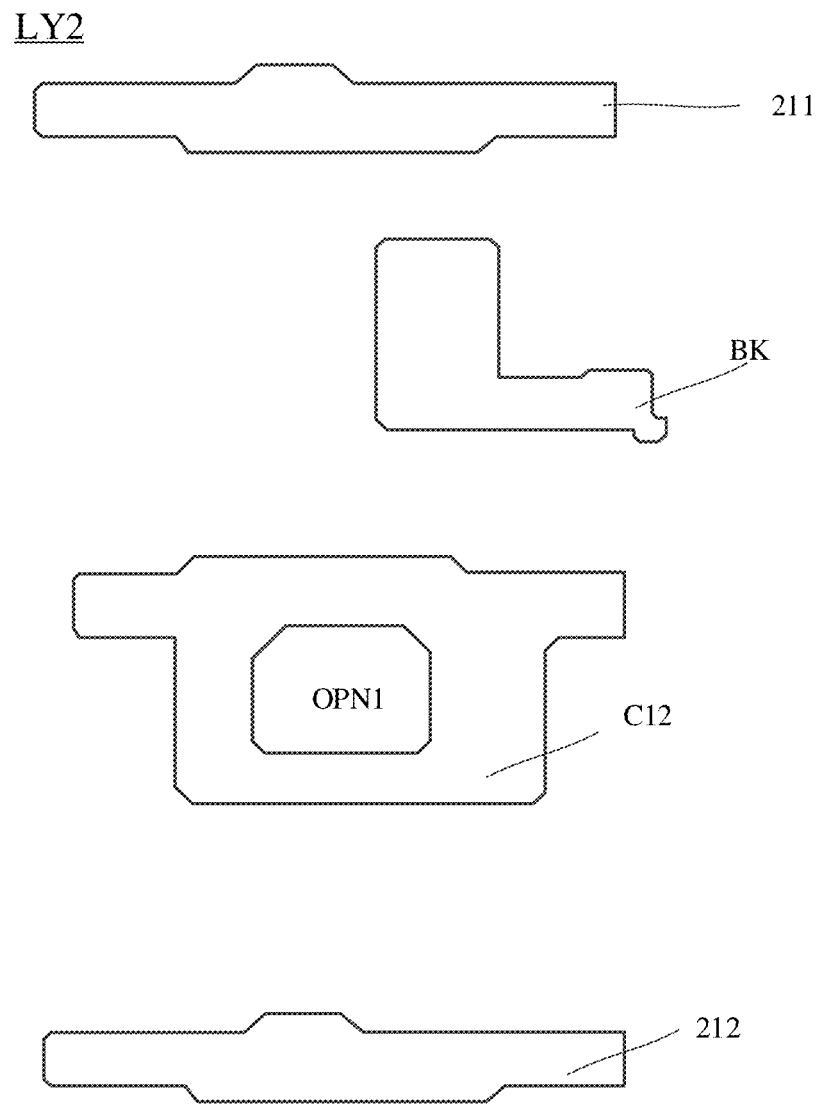
FIG. 23 is a schematic diagram of a second conductive pattern layer formed on a second insulating thin film layer in a manufacturing method of a display substrate according to an embodiment of the present disclosure.

FIG. 23 is a schematic diagram of a second conductive pattern layer formed on a second insulating thin film layer in a manufacturing method of a display substrate according to an embodiment of the present disclosure. The second conductive pattern layer LY2 includes a first initialization signal line 211, a conductive block BK, the second electrode C12 of the storage capacitor C1, and a second initialization signal line 212. The second electrode C12 of the storage capacitor C1 has an opening OPN1. The second electrode C12 of the storage capacitor C1 has an opening OPN1, which facilitates the second connection electrode 31b (see FIG. 18) to be electrically connected with the first electrode C11 of the storage capacitor C1 through the opening OPN1. The second connection electrode 31b and the second electrode C12 of the storage capacitor C1 are insulated from each other. The material of the second conductive pattern layer LY2 includes metal, and the metal includes Molybdenum (Mo), but is not limited thereto.

Figure 24:
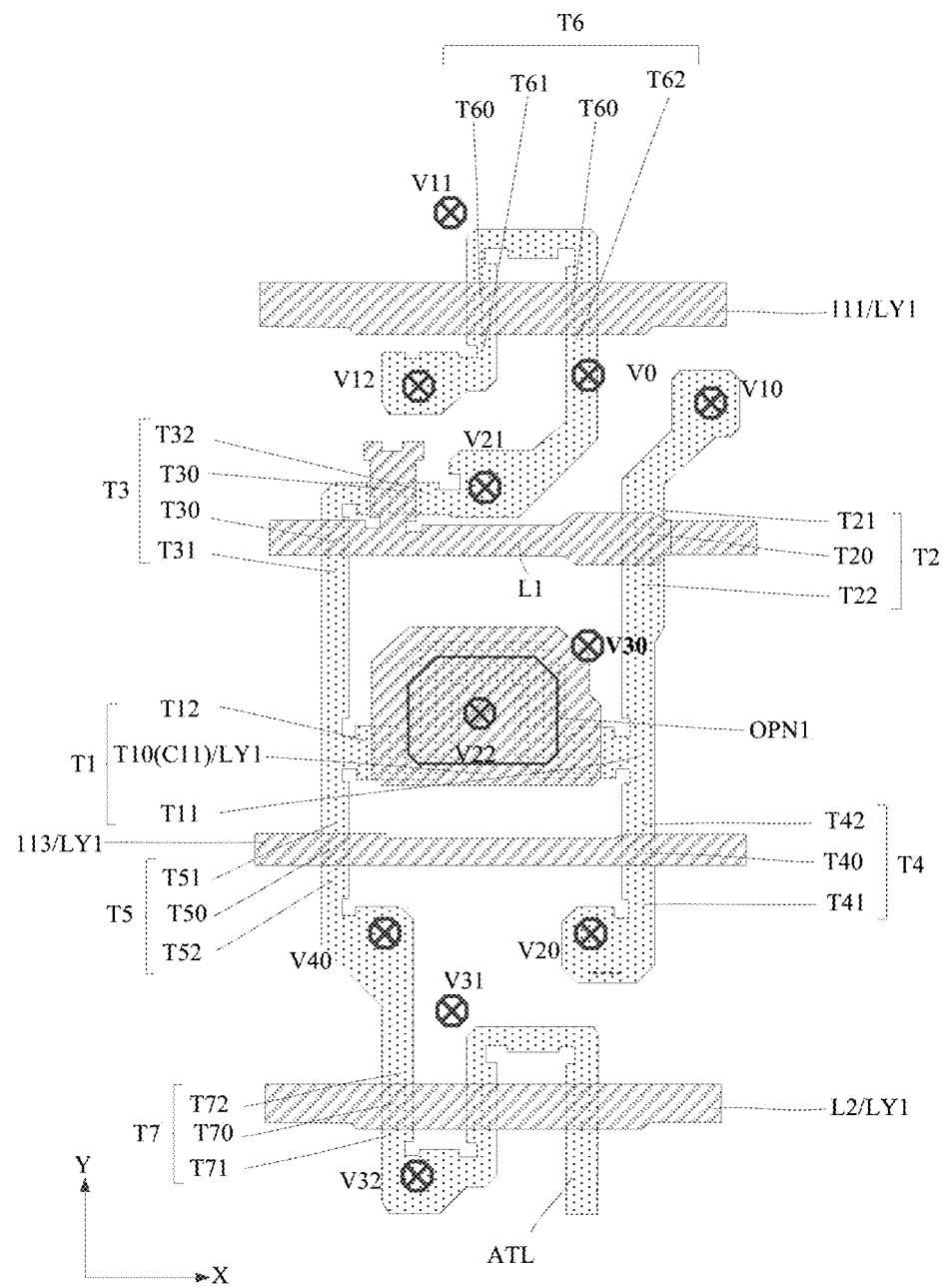
FIG. 24 is a schematic diagram of forming a third insulating thin film layer on a second conductive pattern layer and forming a via hole in at least one of a first insulating thin film layer, a second insulating thin film layer and the third insulating thin film layer in a manufacturing method of a display substrate according to an embodiment of the present disclosure.

FIG. 24 is a schematic diagram of forming a third insulating thin film layer on a second conductive pattern layer and forming a via hole in at least one of a first insulating thin film layer, a second insulating thin film layer and the third insulating thin film layer in a manufacturing method of a display substrate according to an embodiment of the present disclosure. As illustrated in FIG. 24, after the via hole is formed, the first gate insulating layer, the second gate insulating layer and the interlayer insulating layer are formed. The first gate insulating layer, the second gate insulating layer and the interlayer insulating layer are not illustrated in FIG. 24, which can refer to FIG. 19. The third insulating thin film layer can be in a planar shape and cover the base substrate. The first gate insulating layer is a structure after the via hole is formed in the first insulating thin film layer. The second gate insulating layer is a structure after the via hole is formed in the second insulating thin film layer. The interlayer insulating layer is a structure after the via hole is formed in the third insulating thin film layer. The material of the interlayer insulating layer ILD includes at least one of SiOx and SiNx, but is not limited thereto.

As illustrated in FIG. 24, the display panel includes a via hole V40, a via hole V0, a via hole V10, a via hole V20, a via hole V30, a via hole V11, a via hole V12, a via hole V21, a via hole V22, a via hole V31 and a via hole V32.

Figure 25:
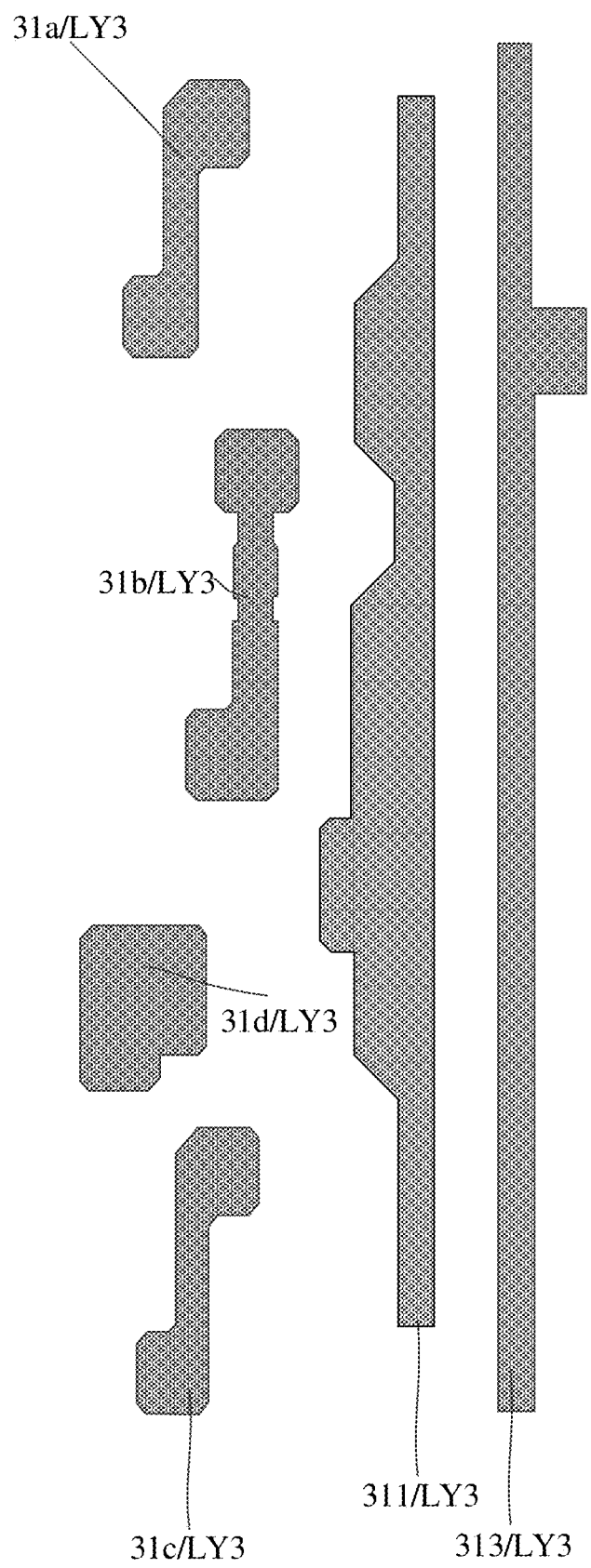
FIG. 25 is a schematic diagram of a third conductive pattern layer formed on an interlayer insulating layer in a manufacturing method of a display substrate according to an embodiment of the present disclosure.

FIG. 25 is a schematic diagram of a third conductive pattern layer formed on an interlayer insulating layer in a manufacturing method of a display substrate according to an embodiment of the present disclosure. As illustrated in FIG. 25, the third conductive pattern layer LY3 includes a first connection electrode 31a, a second connection electrode 31b, a third connection electrode 31c, a fourth connection electrode 31d, a data line 313 and a first power line 311. After forming the third conductive pattern layer, the display substrate illustrated in FIG. 18 can be obtained. For example, the material of the third conductive pattern layer LY3 includes a metal material, and for example, a structure in which three sub-layers of Ti—Al—Ti are stacked may be adopted, which is not limited thereto.

Referring to FIG. 25, FIG. 24 and FIG. 18, the first electrode C11 of the storage capacitor C1 is electrically connected with the second electrode T32 of the threshold compensation transistor T3 through the second connection electrode 31b. The second electrode T32 of the threshold compensation transistor T3 is electrically connected with the gate electrode T10 of the driving transistor T1 through the second connection electrode 31b. The first electrode T61 of the first reset transistor T6 is electrically connected with the first initialization signal line 211 through the first connection electrode 31a. The first electrode T71 of the second reset transistor T7 is electrically connected with the second initialization signal line 212 through the third connection electrode 31c. The fourth connection electrode 31d is electrically connected with the second electrode T52 of the second light emitting control transistor T5.

Figure 26:
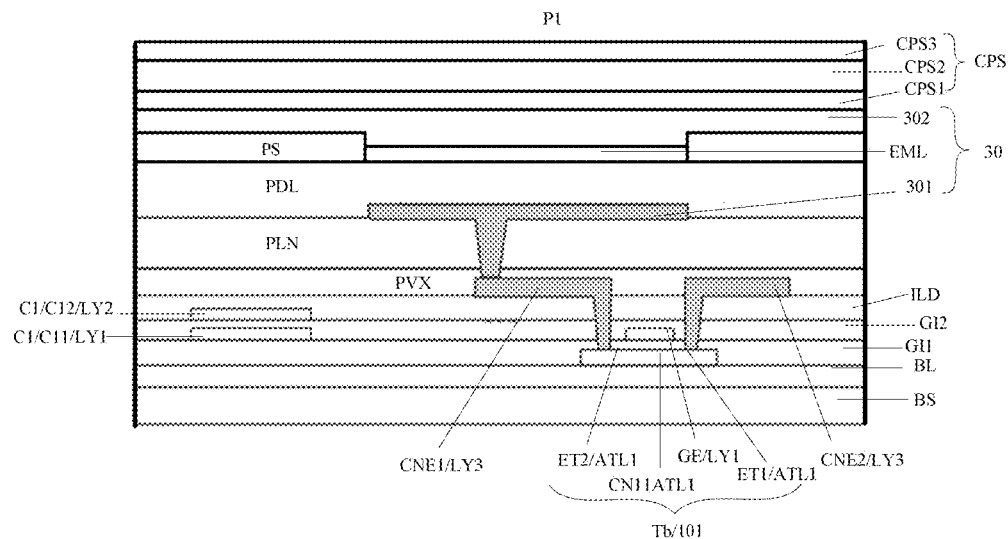
FIG. 26 is a cross-sectional view of a first dummy pixel unit of a display panel according to an embodiment of the present disclosure.

FIG. 26 is a cross-sectional view of a first dummy pixel unit of a display panel according to an embodiment of the present disclosure. As illustrated in FIG. 26, the first dummy pixel unit P1 includes a first dummy pixel circuit 101 and a dummy element 30. As illustrated in FIG. 26, the dummy element 30 includes a first electrode 301, a light emitting functional layer EML and a second electrode 302. The first dummy pixel circuit 101 includes a transistor Tb, the pixel definition layer PDL is not provided with an opening for the first dummy pixel unit P1, and the light emitting functional layer EML of the dummy element 30 is not in contact with the first electrode 301, so that the first dummy pixel unit P1 does not emit light. The pixel defining layer PDL is not provided with an opening in the first dummy region R31, so that the first dummy pixel unit P1 does not emit light. As illustrated in FIG. 26, the pixel defining layer PDL completely covers the first electrode 301 of the dummy element 30, and there is no signal channel communicated with the first dummy pixel unit P1. The first electrode 301 of the dummy element 30 is not in contact with the light emitting functional layer EML of the dummy element 30.

Figure 27:
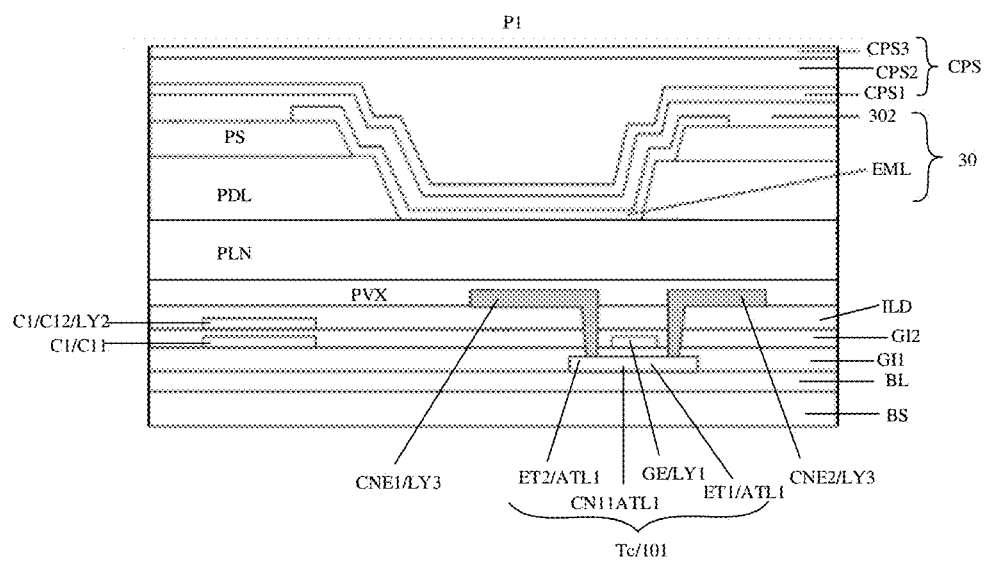
FIG. 27 is a cross-sectional view of a first dummy pixel unit of a display panel according to an embodiment of the present disclosure.

FIG. 27 is a cross-sectional view of a first dummy pixel unit of a display panel according to an embodiment of the present disclosure. As illustrated in FIG. 27, the first dummy pixel unit P1 includes a first dummy pixel circuit 101 and a dummy element 30, the first dummy pixel circuit 101 includes a transistor Tc, and the dummy element 30 includes a light emitting functional layer EML and a second electrode 302. As illustrated in FIG. 27, the dummy element 30 does not include a first electrode 301, and the light emitting functional layer EML of the dummy element 30 is not in contact with the first dummy pixel circuit 101. Therefore, the first dummy pixel unit P1 does not emit light. Although the pixel defining layer PDL in FIG. 27 has an opening, the opening does not penetrate through the planarization layer PLN and the passivation layer PVX, so that the light emitting functional layer EML of the dummy element 30 is not in contact with the first dummy pixel circuit 101.

Figure 28:
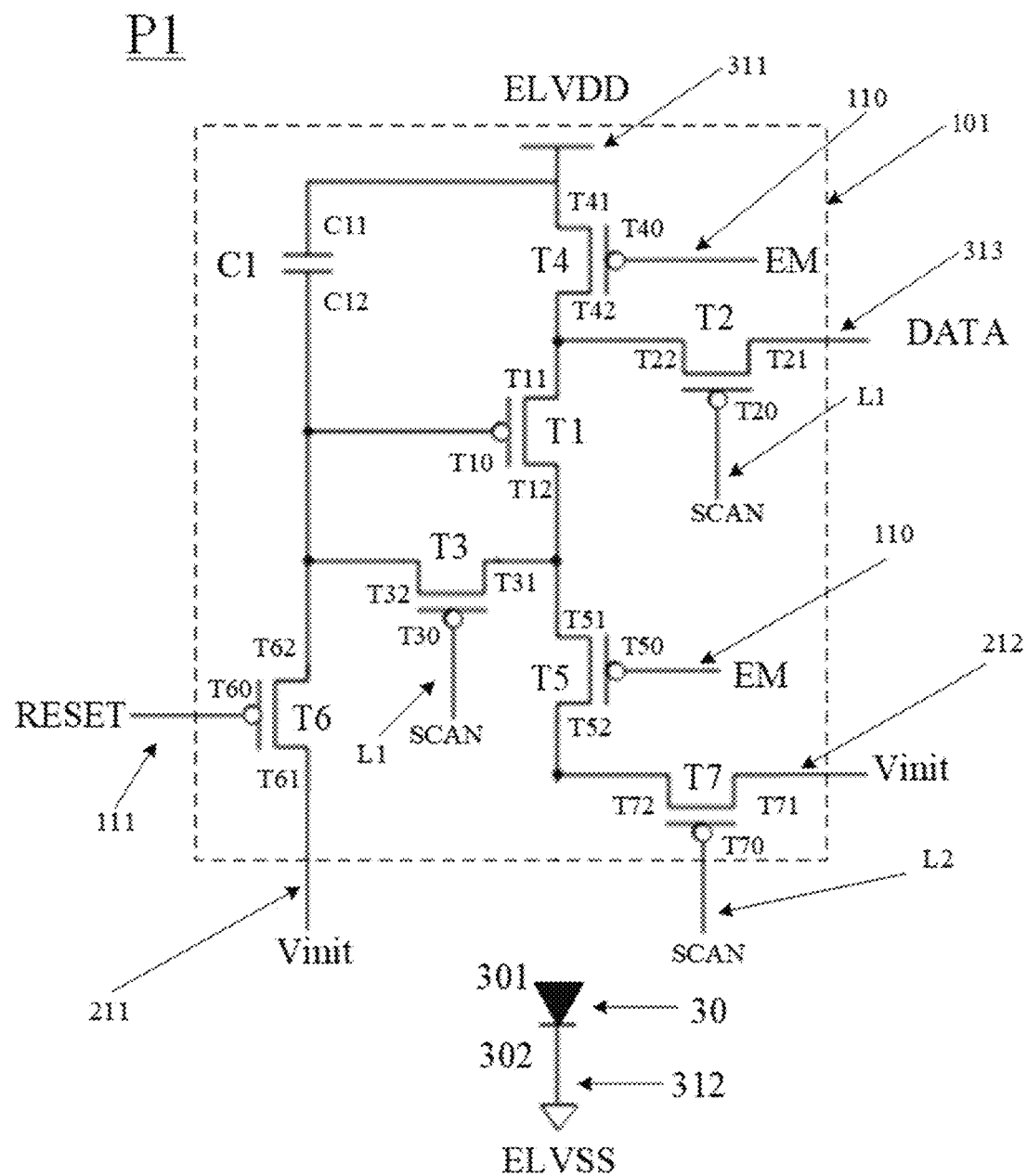
FIG. 28 is a schematic diagram of the structure of a first dummy pixel circuit of a display panel according to an embodiment of the present disclosure.

FIG. 28 is a schematic diagram of the structure of a first dummy pixel circuit of a display panel according to an embodiment of the present disclosure. Compared with the display pixel circuit structure of the display pixel unit illustrated in FIG. 16, the dummy element 30 is not connected with the first dummy pixel circuit structure 101. As illustrated in FIG. 16 and FIG. 28, the structure of the display pixel circuit 101 is the same as the structure of the first dummy pixel circuit 101.

For example, referring to FIG. 4 and FIG. 28, the display panel includes a data line 313, a light emitting control signal line 110, a first power line 311, a second power line 312, a reset control signal line 111, a first initialization signal line 211 and a second initialization signal line 212, wherein the first dummy pixel unit P1 further includes a dummy element 30, the first dummy pixel unit P1 includes a driving transistor T1, a data writing transistor T2, a threshold compensation transistor T3, a first light emitting control transistor T4, a second light emitting control transistor T5, a first reset transistor T6, a second reset transistor T7 and a storage capacitor C1.

The second electrode of the storage capacitor C1 is electrically connected with the first power line 311, and the first electrode of the storage capacitor C1 is electrically connected with the second electrode of the threshold compensation transistor T3.

The gate electrode of the data writing transistor T2 is electrically connected with the first signal line L1, and the first electrode and the second electrode of the data writing transistor T2 are respectively electrically connected with the data line 313 and the first electrode of the driving transistor T1.

The gate electrode of the threshold compensation transistor T3 is electrically connected with the first signal line L1, the first electrode of the threshold compensation transistor T3 is electrically connected with the second electrode of the driving transistor T1, and the second electrode of the threshold compensation transistor T3 is electrically connected with the gate electrode of the driving transistor T1.

The gate electrode of the first light emitting control transistor T4 and the gate electrode of the second light emitting control transistor T5 are both connected with the light emitting control signal line 110.

The first electrode and the second electrode of the first light emitting control transistor T4 are respectively electrically connected with the first power line 311 and the first electrode of the driving transistor T1. The first electrode of the second light emitting control transistor T5 is electrically connected with the second electrode of the driving transistor T1. The second electrode of the dummy element 30 is electrically connected with the second power line 312.

The gate electrode of the first reset transistor T6 is electrically connected with the reset control signal line 111, the first electrode of the first reset transistor T6 is electrically connected with the first initialization signal line 211, and the second electrode of the first reset transistor T6 is electrically connected with the gate electrode of the driving transistor T1.

The gate electrode of the second reset transistor T7 is electrically connected with the second signal line L2, and the first electrode of the second reset transistor T7 is electrically connected with the second initialization signal line 212.

The dummy element 30 is not provided with a first electrode 301, or in the case where the dummy element 30 is provided with a first electrode 301, the second electrode of the second light emitting control transistor T5 is not electrically connected with the first electrode 301 of the dummy element 30, and the second electrode of the second reset transistor T7 is not electrically connected with the first electrode 301 of the dummy element 30.

In the display panel provided by the embodiment of the present disclosure, the load compensation adopts a 3D compensation mode, which includes a lot of nodes and a lot of parasitic capacitances, and the load compensation has a good effect.

Figure 29:
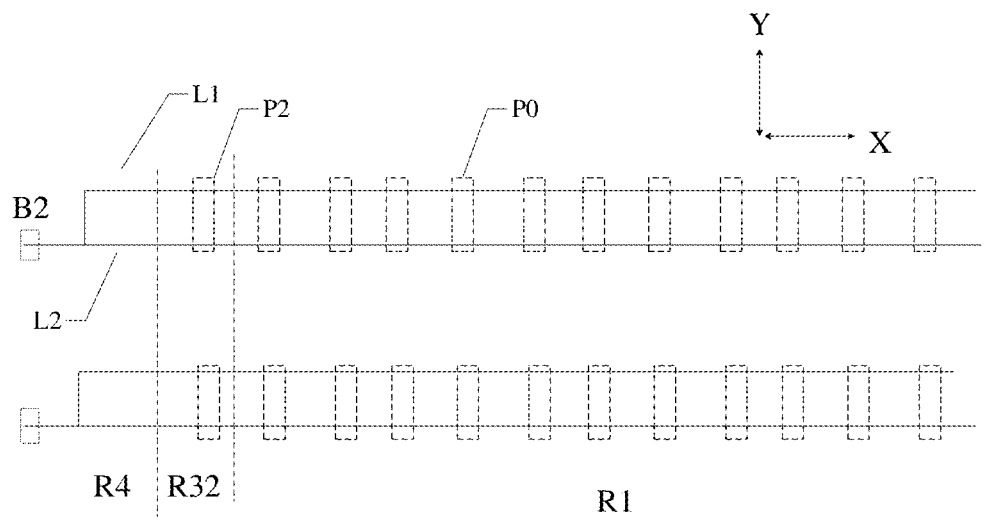
FIG. 29 is a schematic diagram of a display panel using a plate capacitor for load compensation.

FIG. 29 is a schematic diagram of a display panel using a plate capacitor for load compensation. As illustrated in FIG. 29, the dashed box B2 is the arrangement position of the plate capacitor, and the plate capacitor arranged in the lead region R4. However, in terms of a special-shaped region, in the case where the plate capacitor is used as a compensation unit for compensation, the actual compensation value of the plate capacitor is quite different from the theoretical calculation value, and the load of the plate capacitor itself is quite different from the load of the display pixel unit, so the way of using the plate capacitor cannot make up for the load loss. Therefore, compared with the plate capacitor, it has obvious advantages to use the first dummy pixel unit as the compensation unit on the premise of having space. The first dummy pixel unit can make the environment of each first signal line consistent, which can make the load of each first signal line basically consistent, and is also beneficial to the etching uniformity of the first signal line, thus avoiding the inconsistency of the load of the first signal line caused by uneven etching. The inconsistency of the load of the first signal line may result in compensation errors and further affect the display effect.

In the embodiment of the present disclosure, the first signal line L1 can be a gate line, and the second signal line L2 can be a reset control signal line. For example, the second signal line L2 is a second reset control signal line. The reset control signal line 111 is a first reset control signal line.

Comparison of compensation effects between the display panel illustrated in FIG. 8 and the display panel illustrated in FIG. 29 is illustrated in the following table. As can be seen from the table, in the display panel provided by the embodiment of the present disclosure, the compensation load of the first signal line can reach 17.39 fF, and the compensation load of the second signal line can reach 16.40 fF, that is, both the compensation effect of a single first signal line and the compensation effect of a single second signal line are close to the compensation effect in the compensation mode using the plate capacitor as the compensation unit. The sum of the loads compensated by the first signal line and the second signal line is greater than the compensation effect in the compensation mode using the plate capacitor as the compensation unit.

TABLE 1

Comparison of compensation effects between the scheme using the first dummy pixel unit as the compensation unit and the scheme using the plate capacitor as the compensation unit

| | Using the first dummy pixel unit as the compensation unit (scheme 1) | | Using the plate capacitor as the compensation unit (scheme 2) The first signal line (gate line) and the second signal line (reset control signal line) |
|---|---|---|---|
| | The first signal line (gate line) | The second signal line (reset control signal line) | |
| Compensation capacitance (fF) | 17.39 | 16.40 | 20.72 |

In the case where the first signal line and the second signal line are connected, when using the first dummy pixel unit to compensate the load of the first signal line in a certain row, the compensation load includes two parts, one part is the load of the first signal line in the certain row, and the other part is the load of the second signal line connected with the first signal line; however, when using the plate capacitor for compensation, most of the compensation load comes from the compensation unit.

Table 1 shows the capacitance of the first signal line in compensation units of different compensation schemes. As can be seen from the table, when adopting scheme 1 for compensation, the total load of the first signal line and the second signal line is greater than the load of the compensation unit adopting a plate capacitor, and the actual compensation value of the plate capacitor is quite different from the theoretical calculation value thereof, that is, the compensation method adopting the first dummy pixel unit has obvious advantages.

For example, when compensating for the special-shaped display region, the more the compensation units using plate capacitors, the larger the frame being occupied, which results in the increase of the upper frame. The embodiments of the present disclosure maximize the use of the space of the special-shaped display region, thereby reducing the number of compensation units and further reducing the width of the upper frame.

The display panel provided by the embodiments of the present disclosure, on the premise of making full use of the space of the special-shaped display region, uses the first dummy pixel unit as the compensation unit to compensate the light transmitting region, thus not only narrowing the frame, but also better compensating the load, and further achieving a better display effect.

Figure 30:
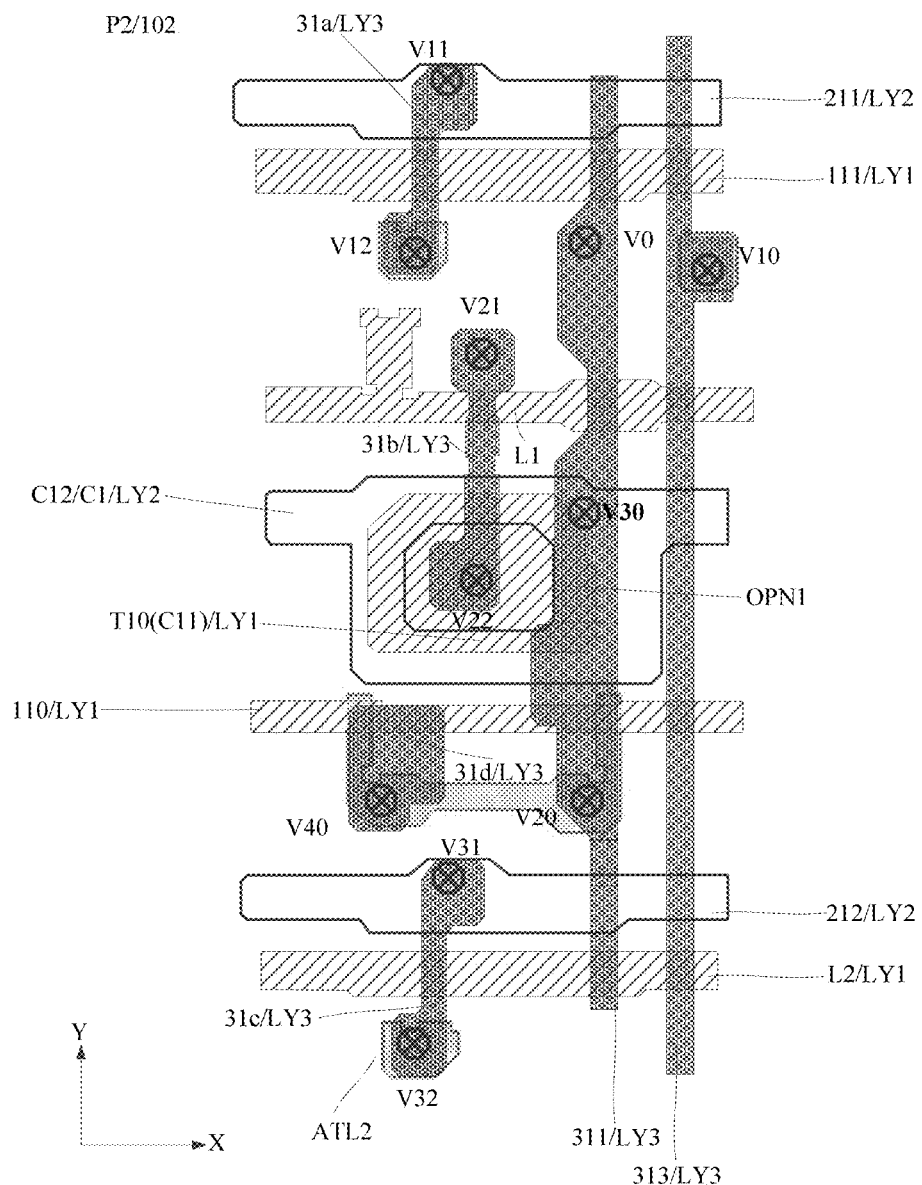
FIG. 30 is a plan view of a second dummy pixel unit in a display panel according to an embodiment of the present disclosure.

FIG. 30 is a plan view of a second dummy pixel unit in a display panel according to an embodiment of the present disclosure. As illustrated in FIG. 30, the second dummy pixel unit P2 includes a second dummy pixel circuit 102. The second dummy pixel circuit 102 only includes a capacitor, and does not include a complete transistor. For example, the active layer ATL2 in the second dummy pixel unit P2 is different from the active layer ATL in the display pixel unit. The structure of the active layer ATL2 is a part of the structure of the active layer ATL. The second dummy pixel unit P2 does not emit light. For example, it does not emit light in the same way as the first dummy pixel unit, but is not limited thereto. For example, the second dummy pixel unit may not include a light emitting functional layer, but is not limited thereto.

At least one embodiment of the present disclosure further provides a display device, which includes any one of the above display panels.

For example, the display device includes an OLED display device or any product or device with display function, such as a computers, a mobile phone, a watch, an electronic picture frame, a navigator, etc., which includes the OLED display device.

What have been described above are only specific implementations of the present disclosure, and the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be determined based on the protection scope of the claims.

What is claimed is:

1. A display panel, comprising:
   a display region;
   a light transmitting region at a side of the display region or surrounded by the display region;
   a first dummy region between the display region and the light transmitting region, the first dummy region being a non-light emitting region;
   a first signal line in the display region and the first dummy region;
   a display pixel unit in the display region and comprising a display pixel circuit; and
   a first dummy pixel unit in the first dummy region and comprising a first dummy pixel circuit,
   wherein the display pixel circuit is connected with the first signal line, and the first dummy pixel circuit is connected with the first signal line,
   the display panel further comprises a second signal line and a connection element,
   wherein the second signal line has a same extending direction as the first signal line, the second signal line is connected with the first signal line through the connection element, and the second signal line is connected with the first dummy pixel unit, the display panel further comprises a data line, a light emitting control signal line, a first power line, a second power line, a reset control signal line, a first initialization signal line and a second initialization signal line, wherein the first dummy pixel unit further comprises a dummy element, and the first dummy pixel unit comprises a driving transistor, a data writing transistor, a threshold compensation transistor, a first light emitting control transistor, a second light emitting control transistor, a first reset transistor, a second reset transistor and a storage capacitor, a first electrode of the storage capacitor is electrically connected with a second electrode of the threshold compensation transistor, and a second electrode of the storage capacitor is electrically connected with the first power line;

a gate electrode of the data writing transistor is electrically connected with the first signal line, and a first electrode and a second electrode of the data writing transistor are respectively electrically connected with the data line and a first electrode of the driving transistor;

a gate electrode of the threshold compensation transistor is electrically connected with the first signal line, a first electrode of the threshold compensation transistor is electrically connected with a second electrode of the driving transistor, and a second electrode of the threshold compensation transistor is electrically connected with a gate electrode of the driving transistor;

a gate electrode of the first light emitting control transistor and a gate electrode of the second light emitting control transistor are both connected with the light emitting control signal line;

a first electrode and a second electrode of the first light emitting control transistor are respectively electrically connected with the first power line and the first electrode of the driving transistor, a first electrode of the second light emitting control transistor is electrically connected with the second electrode of the driving transistor, and a second electrode of the dummy element is electrically connected with the second power line;

a gate electrode of the first reset transistor is electrically connected with the reset control signal line, a first electrode of the first reset transistor is electrically connected with the first initialization signal line, and a second electrode of the first reset transistor is electrically connected with the gate electrode of the driving transistor;

a gate electrode of the second reset transistor is electrically connected with the second signal line, and a first electrode of the second reset transistor is electrically connected with the second initialization signal line;

the dummy element is not provided with a first electrode, or in the case where the dummy element is provided with a first electrode, a second electrode of the second light emitting control transistor is not electrically connected with a first electrode of the dummy element, and a second electrode of the second reset transistor is not electrically connected with the first electrode of the dummy element.

2. The display panel according to claim 1, wherein a structure of the first dummy pixel circuit is the same as a structure of the display pixel circuit.

3. The display panel according to claim 1, wherein both the display pixel circuit and the first dummy pixel circuit include a transistor.

4. The display panel according to claim 1, wherein both the display pixel circuit and the first dummy pixel circuit include a storage capacitor.

5. The display panel according to claim 1, wherein the first signal line comprises a gate line, and the second signal line comprises a reset control signal line.

6. The display panel according to claim 1, wherein a load formed by the first dummy pixel unit connected with the first signal line is smaller than a load missing from the first signal line before compensation.

7. The display panel according to claim 6, wherein the load formed by the first dummy pixel unit connected with the first signal line is 65%-80% of the load missing from the first signal line before compensation.

8. The display panel according to claim 1, further comprising:
a second dummy pixel unit and a second dummy region, wherein the second dummy pixel unit is in the second dummy region, the second dummy region is close to an edge of the display panel and at a side of the first dummy region away from the display region, the second dummy pixel unit comprises a second dummy pixel circuit, and a structure of the second dummy pixel circuit is a part of a structure of the first dummy pixel circuit.

9. The display panel according to claim 1, wherein a plurality of first signal lines are provided, the plurality of first signal lines extending along a first direction, the plurality of first signal lines are arranged along a second direction, the first direction is intersected with the second direction, and loads of the plurality of first signal lines increase linearly in the second direction.

10. The display panel according to claim 1, further comprising a notch, wherein the notch is located in the light transmitting region.

11. The display panel according to claim 10, wherein a plurality of first dummy pixel units are provided, and both ends of the first signal line are connected with the plurality of first dummy pixel units, respectively,
wherein a count of the first dummy pixel units connected with each end of the first signal line is greater than two.

12. The display panel according to claim 11, wherein the first signal line is on at least one side of two opposite sides of the notch in an extending direction of the first signal line, and a count of the first dummy pixel units connected with one end of the first signal line close to the notch is greater than a count of the first dummy pixel units connected with one end of the first signal line away from the notch.

13. The display panel according to claim 10, wherein an edge of the display region close to the light transmitting region is a curve, which includes a valley and ridges respectively arranged at both sides of the valley, and the light transmitting region is located at a position of the valley.

14. The display panel according to claim 13, wherein a slope of a portion of the curve at a side of the ridge close to the notch is greater than a slope of a portion of the curve at a side of the ridge away from the notch.

15. The display panel according to claim 1, wherein a plurality of first signal lines are provided, the plurality of first signal lines extending along a first direction, the plurality of first signal lines are arranged along a second direction, the first direction is intersected with the second direction, and loads of the plurality of first signal lines decrease linearly and then increase linearly in the second direction.

16. The display panel according to claim 15, wherein the light transmitting region is surrounded by the display region; the light transmitting region comprises a through hole region, the through hole region comprises a first through hole region and a second through hole region, the first dummy region includes a portion between the first through hole region and the second through hole region, and the first dummy pixel unit is in the portion of the first dummy region between the first through hole region and the second through hole region.

17. The display panel according to claim 1, further comprising a pixel definition layer, wherein the pixel definition layer is provided with an opening in the display region to define a light emitting area of the display pixel unit, and the pixel definition layer is not provided with an opening in the first dummy region, so that the first dummy pixel unit does not emit light.

18. The display panel according to claim 1, wherein the first dummy pixel unit further comprises a dummy element, the dummy element is not connected with the first dummy pixel circuit, or a first electrode of the dummy element is not in contact with a light emitting functional layer of the dummy element.

\* \* \* \* \*